United States Patent
Lee et al.

(10) Patent No.: US 9,396,988 B2
(45) Date of Patent: Jul. 19, 2016

(54) METHODS FOR FABRICATING SEMICONDUCTOR DEVICES USING LINER LAYERS TO AVOID DAMAGE TO UNDERLYING PATTERNS

(71) Applicants: Kyoung-Woo Lee, Seongnam-si (KR);
Woo-Jin Lee, Suwon-si (KR);
Jong-Sam Kim, Suwon-si (KR);
Woo-Kyung You, Seoul (KR);
Young-Sang Lee, Suwon-si (KR); Min Huh, Osan-si (KR)

(72) Inventors: Kyoung-Woo Lee, Seongnam-si (KR);
Woo-Jin Lee, Suwon-si (KR);
Jong-Sam Kim, Suwon-si (KR);
Woo-Kyung You, Seoul (KR);
Young-Sang Lee, Suwon-si (KR); Min Huh, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/703,556

(22) Filed: May 4, 2015

(65) Prior Publication Data
US 2016/0079115 A1    Mar. 17, 2016

(30) Foreign Application Priority Data
Sep. 16, 2014   (KR) .......................... 10-2014-0122856

(51) Int. Cl.
*H01L 21/02* (2006.01)
*H01L 21/311* (2006.01)
*H01L 21/70* (2006.01)
*H01L 21/768* (2006.01)

(52) U.S. Cl.
CPC .... *H01L 21/76802* (2013.01); *H01L 21/76843* (2013.01)

(58) Field of Classification Search
None
See application file for complete search history.

(56) References Cited

U.S. PATENT DOCUMENTS

| | | | |
|---|---|---|---|
| 6,440,861 B1 | 8/2002 | Liu et al. | |
| 6,514,856 B2 | 2/2003 | Matsumoto | |
| 6,613,666 B2 | 9/2003 | Ma | |
| 6,649,515 B2 | 11/2003 | Moon et al. | |
| 6,787,448 B2 | 9/2004 | Chung | |
| 7,781,332 B2 | 8/2010 | Arnold et al. | |
| 7,968,506 B2 | 6/2011 | Chou et al. | |
| 8,481,423 B2 | 7/2013 | Arnold et al. | |
| 2003/0139034 A1 | 7/2003 | Yuang | |
| 2005/0059234 A1 | 3/2005 | Bera et al. | |
| 2005/0124149 A1* | 6/2005 | Kim | H01L 21/76808 438/618 |
| 2006/0292863 A1* | 12/2006 | Gambino | H01L 21/76814 438/638 |

FOREIGN PATENT DOCUMENTS

| | | |
|---|---|---|
| KR | 1020040008507 | 1/2004 |
| KR | 1020050046428 | 5/2005 |
| KR | 1020050116479 | 12/2005 |

* cited by examiner

*Primary Examiner* — Khaja Ahmad
(74) *Attorney, Agent, or Firm* — Myers Bigel & Sibley, PA

(57) ABSTRACT

A method for fabricating a semiconductor device includes sequentially forming an interlayer insulating layer and a hard mask pattern including a first opening on a substrate including a lower pattern, forming a trench exposing the lower pattern in the interlayer insulating layer using the hard mask pattern, forming a liner layer including a first part formed along sidewalls and a bottom surface of the trench and a second part formed along a top surface of the hard mask pattern, forming a sacrificial pattern exposing the second part of the liner layer in the trench, removing the second part of the liner layer and the hard mask pattern using the sacrificial pattern, and after the removing of the hard mask pattern, removing the sacrificial pattern to expose the first part of the liner layer.

20 Claims, 18 Drawing Sheets

METHODS FOR FABRICATING SEMICONDUCTOR DEVICES USING LINER LAYERS TO AVOID DAMAGE TO UNDERLYING PATTERNS

CROSS-REFERENCE TO RELATED APPLICATION

This application claims priority from Korean Patent Application No. 10-2014-0122856 filed on Sep. 16, 2014 in the Korean Intellectual Property Office, and all the benefits accruing therefrom under 35 U.S.C. 119, the disclosure of which is incorporated by reference herein in its entirety.

BACKGROUND

The present inventive concepts relate to methods for fabricating semiconductor devices.

With advances in the electronic technology, down-scaling of semiconductor devices is rapidly progressing. Accordingly, demands for highly integrated and low-power consuming semiconductor chips may be gradually increasing. In order to achieve high integration and lower power consumption of semiconductor chips, an aspect ratio of a wiring layer may be increased.

In the light of the foregoing, various studies of methods for forming via holes in a secure manner while reducing damage to a lower wiring in the wiring layer having an increased aspect ratio may be conducted.

SUMMARY

The present inventive concepts provide a method for fabricating a semiconductor device, which can improve the reliability and performance of the semiconductor device by removing a hard mask used in a trench process for forming an upper wiring so as not to cause damage to a lower wiring.

The above and other objects of the present inventive concepts will be described in or be apparent from the following description of the embodiments.

According to some embodiments, in a method of fabricating a semiconductor device, an interlayer insulating layer including a hard mask pattern thereon is patterned to define a trench therein. The trench in the interlayer insulating layer exposes a lower pattern on a layer therebelow. Prior to removing the hard mask pattern, a liner layer is formed extending along sidewalls and a bottom surface of the trench. A first etching process is performed to remove the hard mask pattern without removing portions of the liner layer extending along the bottom surface of the trench. After removing the hard mask pattern, a second etching process is performed to remove the portions of the liner layer extending along the bottom surface of the trench.

In some embodiments, the liner layer may contact the lower pattern, and the second etching process may be a wet etching process that is selective between the liner layer and the lower pattern.

In some embodiments, the lower pattern and the hard mask pattern may be formed of a same metal.

In some embodiments, the first etching process may be a wet etching process that is not selective between the hard mask pattern and the liner layer.

In some embodiments, in performing the first etching process to remove the hard mask pattern without removing the portions of the liner layer extending along the bottom surface of the trench, a sacrificial pattern may be formed in the trench covering the liner layer at the bottom surface thereof. The sacrificial pattern may expose portions of the liner layer extending along the sidewalls of the trench. The first etching process may remove the hard mask pattern and the portions of the liner layer extending along the sidewalls of the trench that are exposed by the sacrificial pattern. After removing the hard mask pattern using the first etching process, but prior to the second etching process, the sacrificial pattern may be removed to expose the portions of the liner layer extending along the bottom surface of the trench.

In some embodiments, in performing the second etching process to remove the portions of the liner layer extending along the bottom surface of the trench, the lower pattern may be exposed. After removing the portions of the liner layer extending along the bottom surface of the trench using the second etching process, an upper pattern may be formed in the trench. The upper pattern may contact the lower pattern and may be electrically connected thereto.

In some embodiments, in patterning the interlayer insulating layer to define the trench, a photoresist pattern may be formed on the hard mask pattern. The photoresist pattern may define a narrower opening than that defined by the hard mask pattern. A pre-trench, which may not expose the lower pattern, may be formed in the interlayer insulating layer using the photoresist pattern as an etch mask. Then, the interlayer insulating layer including the pre-trench therein may be etched using the hard mask pattern as an etch mask to expose the lower pattern.

According to an aspect of the present inventive concepts, there is provided a method for fabricating a semiconductor device, the method comprising sequentially forming an interlayer insulating layer and a hard mask pattern including a first opening on a substrate including a lower pattern, forming a trench exposing the lower pattern in the interlayer insulating layer using the hard mask pattern, forming a liner layer including a first part formed along sidewalls and a bottom surface of the trench and a second part formed along a top surface of the hard mask pattern, forming a sacrificial pattern exposing the second part of the liner layer in the trench, removing the second part of the liner layer and the hard mask pattern using the sacrificial pattern, and after the removing of the hard mask pattern, removing the sacrificial pattern to expose the first part of the liner layer.

In some embodiments of the present inventive concepts, the method may further comprise exposing the lower pattern by removing exposed the first part of the liner layer, and forming an upper pattern filling the trench on exposed the lower pattern.

In some embodiments of the present inventive concepts, the exposed first part of the liner layer is removed using a wet etchant having etching selectivity to the lower pattern and the liner layer.

In some embodiments of the present inventive concepts, the interlayer insulating layer includes a lower interlayer insulating layer and an upper interlayer insulating layer formed on the lower interlayer insulating layer, the removing of the hard mask pattern includes exposing the upper interlayer insulating layer. The method may further comprises performing a top corner rounding (TCR) process on the upper interlayer insulating layer between the removing of the exposed first part of the liner layer and the forming of the upper pattern.

In some embodiments of the present inventive concepts, the interlayer insulating layer includes a lower interlayer insulating layer and an upper interlayer insulating layer formed on the lower interlayer insulating layer, the removing of the hard mask pattern includes exposing the upper interlayer insulating layer. The method may further comprises performing a top corner rounding (TCR) process on the upper interlayer insulating layer between the removing of the sacrificial pattern and the removing of the exposed first part of the liner layer.

In some embodiments of the present inventive concepts, the removing of the sacrificial pattern and the performing of the TCR process are performed in-situ.

In some embodiments of the present inventive concepts, the forming of the sacrificial pattern comprises forming a sacrificial layer covering the second part of the liner layer while filling the trench, and exposing the second part of the liner layer by removing a portion of the sacrificial layer.

In some embodiments of the present inventive concepts, the sacrificial layer includes at least one of a spin on hardmask (SOH) and a bottom anti-reflective coating (BARC).

In some embodiments of the present inventive concepts, the portion of the sacrificial layer and the sacrificial pattern are removed using a dry etching process.

In some embodiments of the present inventive concepts, the dry etching process includes an ashing process.

In some embodiments of the present inventive concepts, the second part of the liner layer and the hard mask pattern are removed together using a wet etching process.

In some embodiments of the present inventive concepts, the forming of the trench comprises forming a photoresist layer pattern including a second opening on the hard mask pattern, the second opening overlapping with the first opening and having a smaller width than the first opening, forming a pre-trench in the interlayer insulating layer using the photoresist layer pattern as an etch mask, and after the removing of the photoresist layer pattern, etching the interlayer insulating layer using the hard mask pattern as an etch mask.

In some embodiments of the present inventive concepts, the trench includes an upper trench formed to correspond to the first opening and a lower trench formed on a bottom surface of the upper trench, and the lower trench is formed from the pre-trench extending toward the substrate.

In some embodiments of the present inventive concepts, the lower pattern is exposed by the lower trench.

In some embodiments of the present inventive concepts, the liner layer is formed by at least one of atomic layer deposition or chemical vapor deposition.

In some embodiments of the present inventive concepts, the liner layer has a thickness in a range of about 5 to about 100 Å.

In some embodiments of the present inventive concepts, the liner layer is conformally formed.

In some embodiments of the present inventive concepts, the liner layer includes at least one of aluminum nitride, aluminum oxynitride, aluminum carbonitride, aluminum carbon oxynitride, aluminum oxide, silicon nitride, silicon oxynitride, silicon carbonitride, silicon carbon oxynitride, and silicon oxide.

In some embodiments of the present inventive concepts, the lower pattern includes at least one of copper, tungsten, cobalt, titanium and aluminum.

In some embodiments of the present inventive concepts, the hard mask pattern includes at least one of titanium, titanium nitride, titanium oxide, tungsten, tungsten nitride, and tungsten oxide.

According to another aspect of the present inventive concepts, there is provided a method for fabricating a semiconductor device, the method comprising forming an interlayer insulating layer on a substrate including a lower pattern, forming a hard mask pattern including the same metal element with the lower pattern on the interlayer insulating layer, forming a trench exposing the lower pattern in the interlayer insulating layer using the hard mask pattern, forming a liner layer including a first part formed along sidewalls and a bottom surface of the trench and a second part formed along a top surface of the hard mask pattern, removing the second part of the liner layer and the hard mask pattern together using a first wet etching process, and after the removing of the hard mask pattern, etching the first part of the liner layer using a second wet etching process.

In some embodiments of the present inventive concepts, a portion of the first part of the liner layer contacts the lower pattern.

In some embodiments of the present inventive concepts, the first wet etching process is performed using a wet etchant having no etching selectivity to the liner layer and the hard mask pattern.

In some embodiments of the present inventive concepts, the second wet etching process is performed using a wet etchant having etching selectivity to the liner layer and the lower pattern.

In some embodiments of the present inventive concepts, the liner layer includes at least one of aluminum nitride, aluminum oxynitride, aluminum carbonitride, aluminum carbon oxynitride, aluminum oxide, silicon nitride, silicon oxynitride, silicon carbonitride, silicon carbon oxynitride, and silicon oxide.

In some embodiments of the present inventive concepts, the removing of the second part of the liner layer and the hard mask pattern comprises forming a sacrificial pattern in the trench, the sacrificial pattern blocking the first part of the liner layer, and etching the second part of the liner layer and the hard mask pattern together using the sacrificial pattern as an etch mask.

In some embodiments of the present inventive concepts, the forming of the sacrificial pattern comprises forming a sacrificial layer covering the second part of the liner layer while filling the trench, and exposing the second part of the liner layer by removing a portion of the sacrificial layer.

In some embodiments of the present inventive concepts, the lower pattern is exposed by the second wet etching process.

In some embodiments of the present inventive concepts, the method may further comprise forming an upper pattern being in contact with the exposed lower pattern in the trench.

In some embodiments of the present inventive concepts, the second wet etching process does not etch the lower pattern.

In some embodiments of the present inventive concepts, the metal element includes at least one of titanium and tungsten.

In some embodiments of the present inventive concepts, the lower pattern includes a barrier layer and a wiring layer, and at least one of the barrier layer and the wiring layer include metal compound included in the hard mask pattern.

According to still another aspect of the present inventive concepts, there is provided a method for fabricating a semiconductor device, the method comprising forming a lower interlayer insulating layer, an upper interlayer insulating layer and a hard mask pattern on a substrate including a lower pattern, the hard mask pattern including titanium nitride, forming a trench exposing the lower pattern in each of the upper interlayer insulating layer and the lower interlayer insulating layer using the hard mask pattern, conformally forming an aluminum compound layer along sidewalls and a bottom surface of the trench and a top surface of the hard mask pattern, forming a sacrificial layer covering the aluminum compound layer while filling the trench, forming a sacrificial pattern exposing the aluminum compound layer formed on a top surface of the hard mask pattern by removing a portion of the sacrificial layer, removing the aluminum compound layer formed on the top surface of the hard mask pattern and the hard mask pattern together using the sacrificial pattern as a wet etch mask, exposing the aluminum compound layer formed in the trench by removing the sacrificial pattern, and exposing the lower pattern by removing the exposed aluminum compound layer in the trench using a first wet etching process.

In some embodiments of the present inventive concepts, the method may further comprise performing a top corner rounding (TCR) process on the upper interlayer insulating layer between the removing of the sacrificial pattern and the performing of the first wet etching process.

In some embodiments of the present inventive concepts, the method may further comprise performing a TCR process on the upper interlayer insulating layer after the performing of the first wet etching process.

In some embodiments of the present inventive concepts, the removing of the hard mask pattern is performed using the second wet etching process, and the first wet etching process and the second wet etching process are performed using different wet etchants.

In some embodiments of the present inventive concepts, the aluminum compound layer includes at least one of aluminum nitride, aluminum oxynitride, aluminum carbonitride, aluminum carbon oxynitride, and aluminum oxide.

In some embodiments of the present inventive concepts, the lower pattern includes a barrier layer and a wiring layer, the barrier layer includes at least one of titanium and titanium nitride, and the wiring layer includes at least one of tungsten and cobalt.

In some embodiments of the present inventive concepts, the lower interlayer insulating layer includes a low-k dielectric material layer.

BRIEF DESCRIPTION OF THE DRAWINGS

The above and other features and advantages of the present inventive concepts will become more apparent by describing in detail embodiments thereof with reference to the attached drawings in which.

DETAILED DESCRIPTION OF EMBODIMENTS

Figure 1:
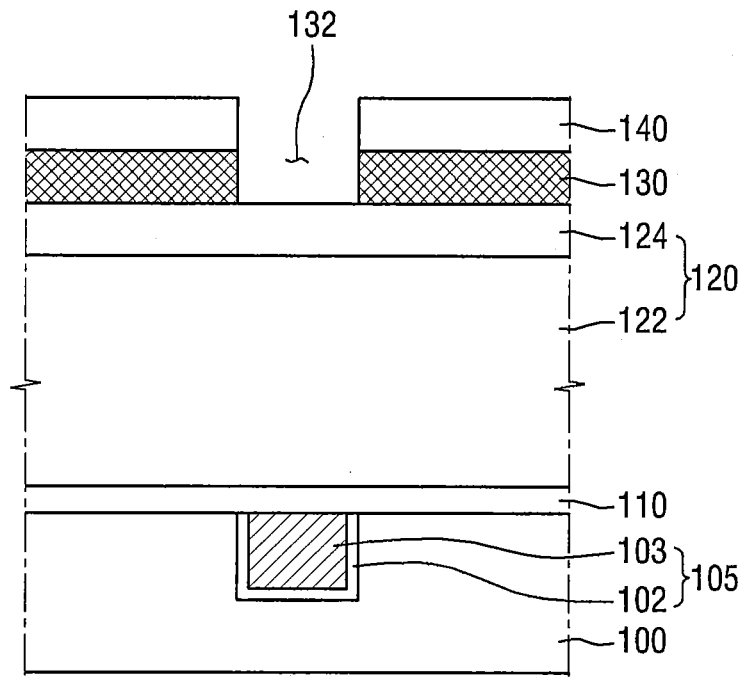
FIGS. 1 to 10 illustrate intermediate process steps for explaining methods for fabricating semiconductor devices according to some embodiments of the present inventive concepts.

The present inventive concepts will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Variations from the shapes of the illustrations as a result, for example, of manufacturing techniques and/or tolerances, are to be expected. Thus, embodiments of the inventive concepts should not be construed as being limited to the particular shapes of regions illustrated herein but are to include deviations in shapes that result, for example, from manufacturing.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, methods for fabricating semiconductor devices according to some embodiments of the present inventive concepts will be described with reference to FIGS. 1 to 10.

FIGS. 1 to 10 illustrate intermediate process steps for explaining methods for fabricating semiconductor devices according to some embodiments of the present inventive concepts.

Referring to FIG. 1, a first etch stop layer 110 and a first interlayer insulating layer 120 are sequentially formed on a substrate 100 including a lower pattern 105.

Next, first mask patterns 130 and 140 including a first opening 132 are formed on the first interlayer insulating layer 120.

In detail, the lower pattern 105 is formed on the substrate 100. The substrate 100 may have a stacked structure having a base substrate and an epitaxial layer stacked, but is not limited thereto. The substrate 100 may be a silicon substrate, a gallium arsenide substrate, a silicon germanium substrate, a ceramic substrate, a quartz substrate, or a glass substrate for display. In some embodiments, the substrate 100 may be a semiconductor on insulator (SOI). In the following description, a silicon substrate is described by way of example. In addition, the substrate 100 may be configured such that an insulating layer is formed on a silicon substrate.

In methods for fabricating semiconductor devices according to embodiments of the present inventive concepts, the following description will be made with reference to the lower pattern 105 as a metal wiring, which is described by way of example, but aspects of the present disclosure are not limited thereto. That is to say, the lower pattern 105 may be a transistor or a diode formed in the substrate 100. In detail, the lower pattern 105 may be a gate electrode or a source/drain of a transistor.

The lower pattern 105 included in the substrate 100 may include a conductive material. The lower pattern 105 may include a lower barrier layer 102 and a lower wiring layer 103.

The lower wiring layer 103 may include, for example, aluminum (Al), copper (Cu), tungsten (W), cobalt (Co) and/or combinations thereof.

The lower barrier layer 102 may be formed between the lower wiring layer 103 and the substrate 100. For example, the lower barrier layer 102 may be conformally formed along a recess in the substrate 100. The lower barrier layer 102 may include, for example, tantalum, tantalum nitride, titanium, titanium nitride, ruthenium, cobalt, nickel, nickel boron (NiB), tungsten nitride, etc. In the illustrated embodiment, the lower barrier layer 102 is a single layer. However, the lower barrier layer 102 may include multiple layers.

The first etch stop layer 110 is formed on the substrate 100 including the lower pattern 105. The first etch stop layer 110 may serve as a capping layer for protecting the lower pattern 105. The first etch stop layer 110 may include, for example, silicon nitride, silicon oxynitride, and/or silicon carbonitride. The first etch stop layer 110 may be formed by, for example, chemical vapor deposition and/or atomic layer deposition. In the following description, it is assumed that the first etch stop layer 110 includes, for example, silicon carbonitride (SiCN).

The first interlayer insulating layer 120 is formed on the first etch stop layer 110. The first interlayer insulating layer 120 may include, for example, silicon oxide, silicon nitride, silicon oxynitride and/or a low-k material.

The first interlayer insulating layer 120 may include a first lower interlayer insulating layer 122 and the first upper interlayer insulating layer 124. For example, the first lower interlayer insulating layer 122 and the first upper interlayer insulating layer 124 may include a low-k material to suppress a coupling between wirings. In addition, the first upper interlayer insulating layer 122 may include a material capable of improving adhesion between the first mask patterns 130 and 140 positioned on the first interlayer insulating layer 120.

Examples of the low-k material may include flowable oxide (FOX), Tonen silazene (TOSZ), undoped silicate glass (USG), borosilica glass (BSG), phosphosilaca glass (PSG), borophosphor silica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and/or combinations thereof, but are not limited thereto.

The first interlayer insulating layer 120 may include a material having etching selectivity to the first etch stop layer 110.

The following description will be made assuming that the first lower interlayer insulating layer 122 includes a low-k dielectric material and the first upper interlayer insulating layer 124 includes silicon oxynitride (SiON).

The first interlayer insulating layer 120 may be formed by, for example, chemical vapor deposition, spin coating, plasma enhanced CVD (PECVD), and/or high density plasma CVD (HDP-CVD).

The first mask patterns 130 and 140 are formed on the first interlayer insulating layer 120. The first mask patterns 130 and 140 may include a first lower mask pattern 130 and a first upper mask pattern 140.

Of the first mask patterns 130 and 140, the first lower mask pattern 130 may be, for example, a hard mask pattern. The first lower mask pattern 130 may include, for example, at least one of titanium nitride, titanium, titanium oxide, tungsten, tungsten nitride, tungsten oxide, tantalum, tantalum nitride and/or tantalum oxide.

In some cases, the first lower mask pattern 130 and the lower pattern 105 may include the same metal element, such as titanium, tungsten, and/or tantalum. In more detail, the first lower mask pattern 130 and the lower pattern 105 may include the same metal compound.

The first upper mask pattern 140 may include, for example, silicon oxide, silicon nitride, and/or silicon oxynitride. For example, the first upper mask pattern 140 may include the same material as the first upper interlayer insulating layer 124, but is not limited thereto.

In detail, a first lower mask layer and a first upper mask layer are sequentially formed on the first interlayer insulating layer 120. In order to pattern the first upper mask layer, a photoresist layer pattern may be formed on the first upper mask layer. During a photolithography process, the first upper mask layer may include, for example, an anti-reflection coating.

Thereafter, the first upper mask pattern 140 may be formed using the photoresist layer pattern as an etch mask. After removing the photoresist layer pattern, the first lower mask pattern 130 including a first opening 132 may be formed using the first upper mask pattern 140 as an etch mask, but is not limited thereto. The first upper mask pattern 140 and the first lower mask pattern 130 may be simultaneously formed using the photoresist layer pattern formed on the first upper mask layer as an etch mask.

The first opening 132 exposes the first interlayer insulating layer 120, specifically, the first upper interlayer insulating layer 124. In FIG. 1, the first opening 132 exposing a top surface of the first upper interlayer insulating layer 124 is illustrated, but aspects of the present disclosure are not limited thereto. A portion of the first upper interlayer insulating layer 124 may be recessed.

In FIG. 1, in order to form the first lower mask pattern 130, after forming the first upper mask pattern 140, the first lower mask pattern 130 is formed using the first upper mask pattern 140 as a mask, but aspects of the present disclosure are not limited thereto. After forming a photoresist layer pattern directly on a lower mask layer, the first lower mask pattern 130 may be formed using the photoresist layer pattern as an etch mask.

Figure 2:
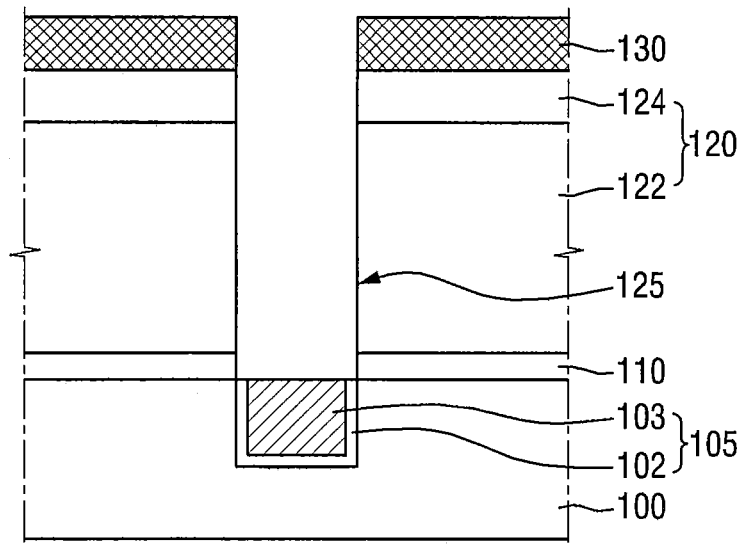

Referring to FIG. 2, a first trench 125 is formed in the first interlayer insulating layer 120 using the first lower mask pattern 130 as an etch mask. The first trench 125 expose the lower pattern 105 disposed under the first interlayer insulating layer 120.

That is to say, the first trench 125 may be formed to sequentially pass or extend through the first upper interlayer insulating layer 124, the first lower interlayer insulating layer 122 and the first etch stop layer 110.

In detail, the first trench 125 is formed in the first interlayer insulating layer 120 by etching the first interlayer insulating layer 120 exposed by the first opening 132, that is, by sequentially etching the first upper interlayer insulating layer 124 and the first lower interlayer insulating layer 122.

Since there may be etching selectivity between the first interlayer insulating layer 120 and the first etch stop layer 110, the first interlayer insulating layer 120 may be subjected to an etching process to be removed, followed by etching the first etch stop layer 110 for removal. The lower pattern 105 is exposed by removing a portion of the first etch stop layer 110 on the substrate 100, thereby forming the first trench 125.

The etching process for forming the first trench 125 may be, for example, a dry etching process.

When the first trench 125 is formed, the first upper mask pattern 140 positioned on the first lower mask pattern 130 may also be etched to then be removed. In methods for fabricating semiconductor devices according to some embodiments of the present inventive concepts, it has been described that the first upper mask pattern 140 is removed during the etching process for forming the first trench 125, but aspects of the present disclosure are not limited thereto. That is to say, the first upper mask pattern 140 may be removed after the first lower mask pattern 130 is formed, as shown in FIG. 1.

Figure 3:
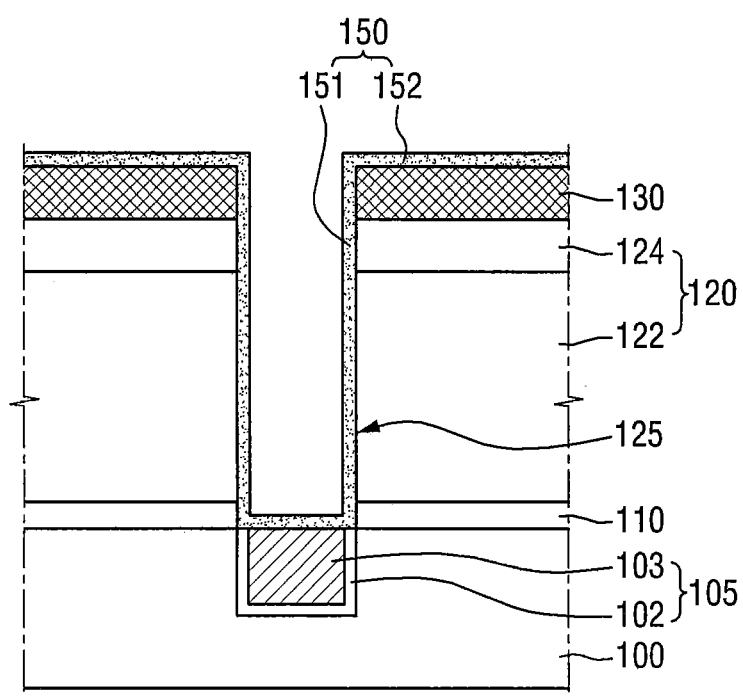

Referring to FIG. 3, a first liner layer 150 is formed on the first lower mask pattern 130. The first liner layer 150 is formed on sidewalls and a bottom surface of the first trench 125 and on the first lower mask pattern 130.

The first liner layer 150 may include a first part 151 and a second part 152. The first part 151 of the first liner layer 150 is formed along the sidewalls and the bottom surface of the first trench 125. The second part 152 of the first liner layer 150 is formed along a top surface of the first lower mask pattern 130.

A portion of the first part 151 of the first liner layer 150 may contact the lower pattern 105. That is to say, the first part 151 of the first liner layer 150 formed on the bottom surface of the first trench 125 may contact the lower pattern 105.

For example, the first liner layer 150 may be conformally formed along the sidewalls and the bottom surface of the first trench 125 and on the first lower mask pattern 130. The first liner layer 150 may be formed to a thickness in a range of, for example, about 5 Angstroms (Å) to about 100 Å.

The first liner layer 150 may be formed by, for example, atomic layer deposition (ALD) and/or chemical vapor deposition (CVD).

The first liner layer 150 may include, for example, an insulating material. The first liner layer 150 may include an aluminum compound and/or a silicon compound. The first liner layer 150 may include, for example, aluminum nitride, aluminum oxynitride, aluminum carbonitride, aluminum carbon oxynitride, aluminum oxide, silicon nitride, silicon oxynitride, silicon carbonitride, silicon carbon oxynitride, and/or silicon oxide.

Figure 4:
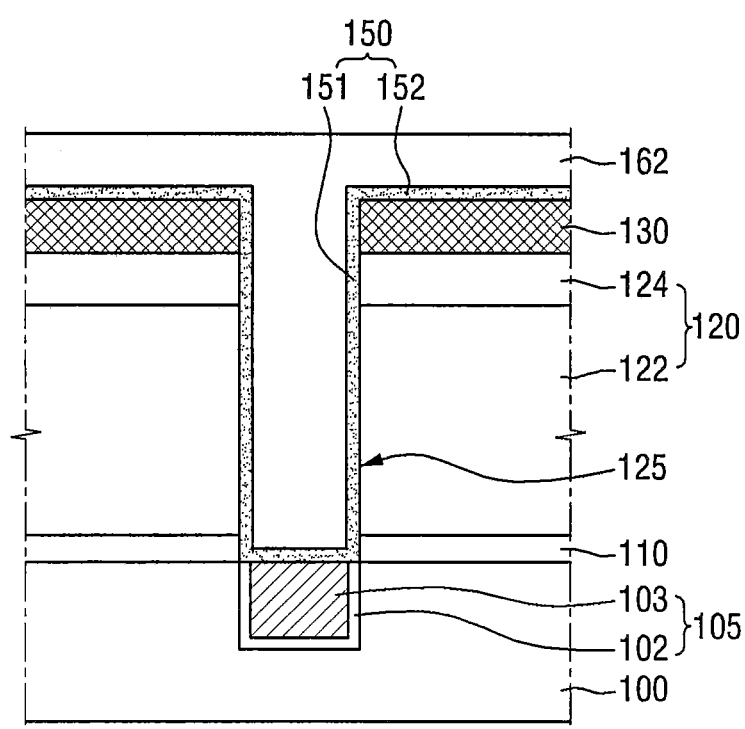

Referring to FIG. 4, a first sacrificial layer 162 is formed, the first sacrificial layer 162 covering the first liner layer 150 while filling the first trench 125.

The first sacrificial layer 162 fills the first trench 125 where the first liner layer 150 is formed. The first sacrificial layer 162 is formed on the first lower mask pattern 130 having the first liner layer 150.

In other words, the first sacrificial layer 162 is formed on the first part 151 of the first liner layer 150 in the first trench 125 and on the second part 152 of the first liner layer 150 outside the first trench 125 on the top surface of the first lower mask pattern 130.

The first sacrificial layer 162 may include a material having good gap-filling capacity or characteristics. The first sacrificial layer 162 may include, for example, a spin on hardmask (SOH) and/or a bottom anti-reflective coating (BARC), but aspects of the present disclosure are not limited thereto.

Figure 5:
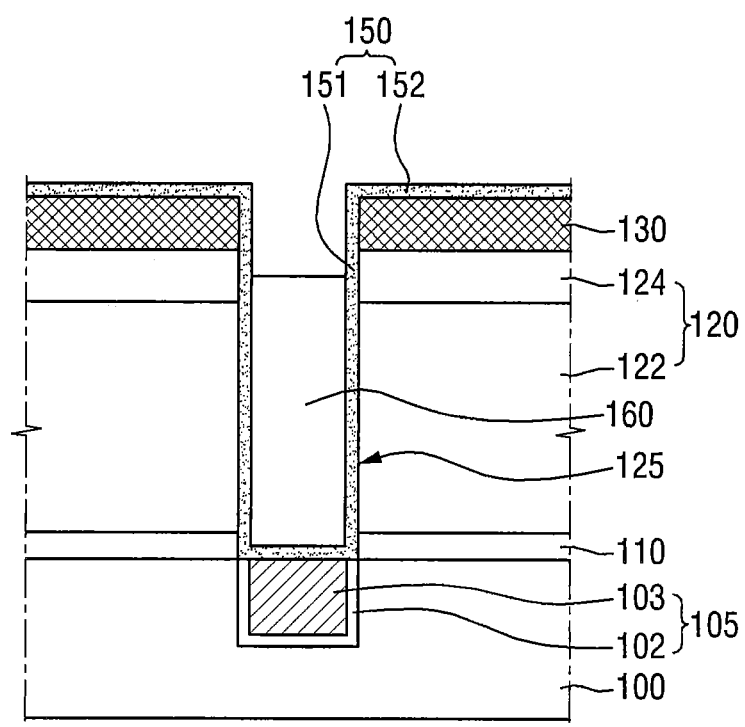

Referring to FIG. 5, a first sacrificial pattern 160 is formed in the first trench 125. Since the first sacrificial pattern 160 is formed in the first trench 125, the second part 152 of the first liner layer 150 is exposed by the first sacrificial pattern 160.

In detail, a portion of the first sacrificial layer 162 covering the first liner layer 150 is removed. The first sacrificial layer 162 formed on the second part 152 of the first liner layer 150 is removed. The remaining portion resulting from the removing of the portion of the first sacrificial layer 162 may become the first sacrificial pattern 160.

For example, a top surface of the first sacrificial pattern 160 may be recessed relative to the top surface of the first interlayer insulating layer 120, which is, however, provided only for convenience in explanation, but aspects of the present disclosure are not limited thereto.

The first sacrificial layer 162 formed on the second part 152 of the first liner layer 150 may be removed by, for example, a dry etching process. A portion of the first sacrificial layer 162 may be removed by, for example, an ashing process.

Accordingly, the first sacrificial pattern 16Q exposing the second part 152 of the first liner layer 150 is formed in the first trench 125. When the second part 152 of the first liner layer 150 is exposed, a portion of the first part 151 of the first liner layer 150 formed along the sidewalls of the first trench 125 may also be exposed, but aspects of the present disclosure are not limited thereto.

In methods for fabricating semiconductor devices according to embodiments of the present inventive concepts, the first sacrificial pattern 160 may block the first liner layer 150 formed in the first trench 125, that is, the first part 151 of the first liner layer 150. In more detail, the first sacrificial pattern 160 may protect portions of the first liner layer 150 formed on or otherwise extending along the bottom surface of the first trench 125 from being removed by a subsequent wet etching process 10.

Figure 6:
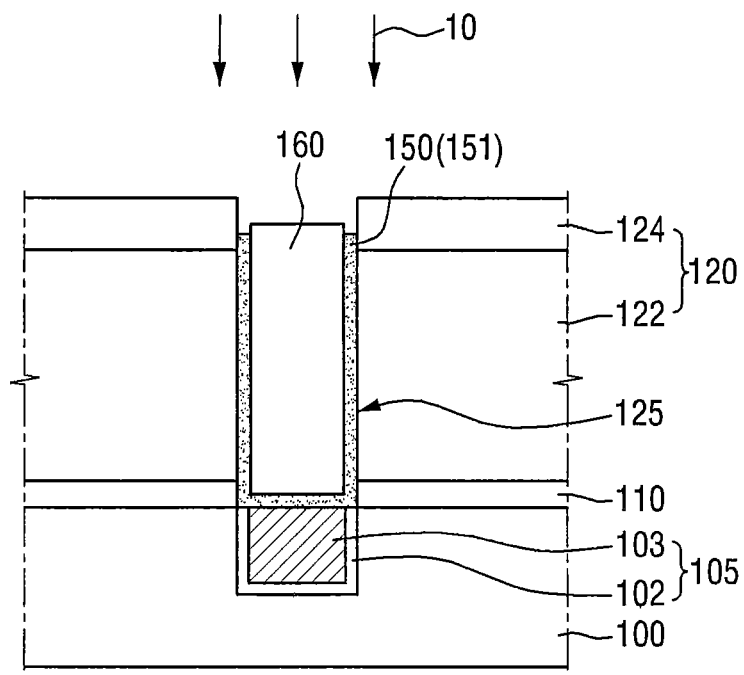

Referring to FIG. 6, the second part 152 of the first liner layer 150 and the first lower mask pattern 130 are removed using the first sacrificial pattern 160 as a mask.

Accordingly, the first interlayer insulating layer 120, that is, the first upper interlayer insulating layer 124, is exposed. In addition, in the first liner layer 150, the first part 151 of the first liner layer 150, extending along the sidewalls and the bottom surface of the first trench 125, may remain.

The second part 152 of the first liner layer 150 and the first lower mask pattern 130 may be removed by, for example, a first wet etching process 10. The first sacrificial pattern 160 may be used as an etch mask in the first wet etching process 10.

In detail, the second part 152 of the first liner layer 150 exposed by the first sacrificial pattern 160 is removed by the first wet etching process 10. In addition, the first lower mask pattern 130 positioned on the first interlayer insulating layer 120 is removed by the first wet etching process 10. However, the first part 151 of the first liner layer 150 covered by the first sacrificial pattern 160 is not removed by the first wet etching process 10.

However, portions of the first part 151 of the first liner layer 150 formed on the sidewalls of the first trench 125, which are exposed by the first sacrificial pattern 160, may be removed. In addition, a portion of the first liner layer 150 positioned between the first sacrificial pattern 160 and the first interlayer insulating layer 120 may also be removed, because the second part 152 of the first liner layer 150 is removed by the first wet etching process 10.

In methods for fabricating semiconductor devices according to embodiments of the present inventive concepts, the first wet etching process 10 may employ a first wet etchant having no etching selectivity to the first liner layer 150 and the first lower mask pattern 130. In other words, the first wet etchant is capable of etching not only the first liner layer 150 but also the first lower mask pattern 130.

Therefore, the second part 152 of the first liner layer 150 and the first lower mask pattern 130 are removed together by the first wet etching process 10.

Figure 7:
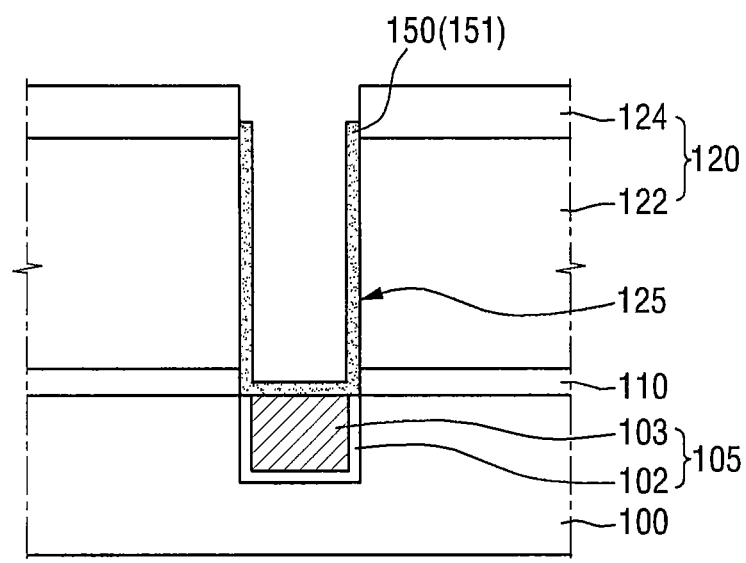

Referring to FIG. 7, the first sacrificial pattern 160 formed in the first trench 125 is removed. The first part 151 of the first liner layer 150 formed in the first trench 125 is exposed by removing the first sacrificial pattern 160.

That is to say, the first liner layer 150 formed in the first trench 125 is exposed by removing the first sacrificial pattern 160.

The first sacrificial pattern 160 formed in the first trench 125 may be removed by, for example, a dry etching process. The first sacrificial pattern 160 may be removed by, for example, an ashing process.

Figure 8:
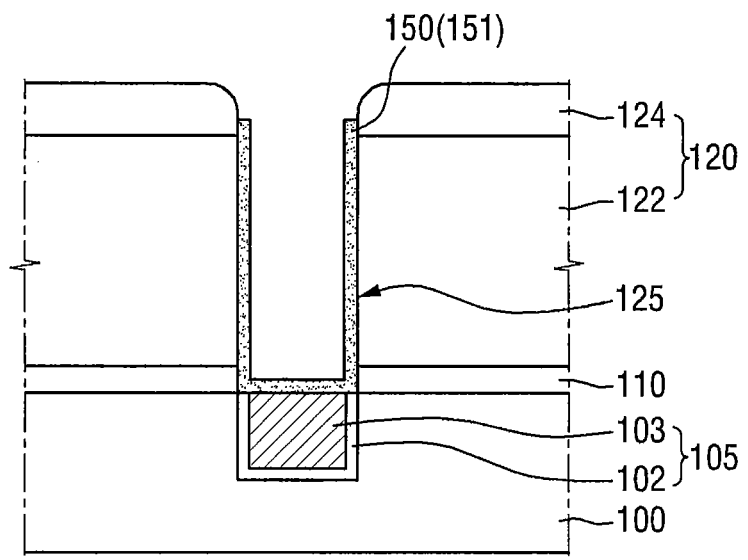

Referring to FIG. 8, a top corner rounding (TCR) process is performed on the first upper interlayer insulating layer 124.

A top corner of the first upper interlayer insulating layer 124 may be angled. In such a case, the TCR process may be additionally performed on the first upper interlayer insulating layer 124.

The top corner of the first upper interlayer insulating layer 124 may be made to be round by performing the TCR process. That is to say, the upper portion of the first trench 125 may be rounded as the result of performing the TCR process.

The TCR process may be performed by, for example, an etching process.

The removing of the first sacrificial pattern 160 and the performing of the TCR process may be performed, for example, in-situ, but aspects of the present disclosure are not limited thereto. That is to say, the removing of the first sacrificial pattern 160 shown in FIG. 7 and the performing of the TCR process shown in FIG. 8 may be performed in-situ.

The upper portion of the first trench 125 rounded by the TCR process may facilitate forming of a first upper pattern (170 of FIG. 10) in a later process. In more detail, since the upper portion of the first trench 125 is rounded, a first upper wiring layer 173 is capable of filling the first trench 125 more easily.

In methods for fabricating semiconductor devices according to embodiments of the present inventive concepts, the top corner of the first upper interlayer insulating layer 124 is rounded by performing the TCR process, but aspects of the present disclosure are not limited thereto. That is to say, since the TCR process is an optional process, it may not be performed.

Figure 9:
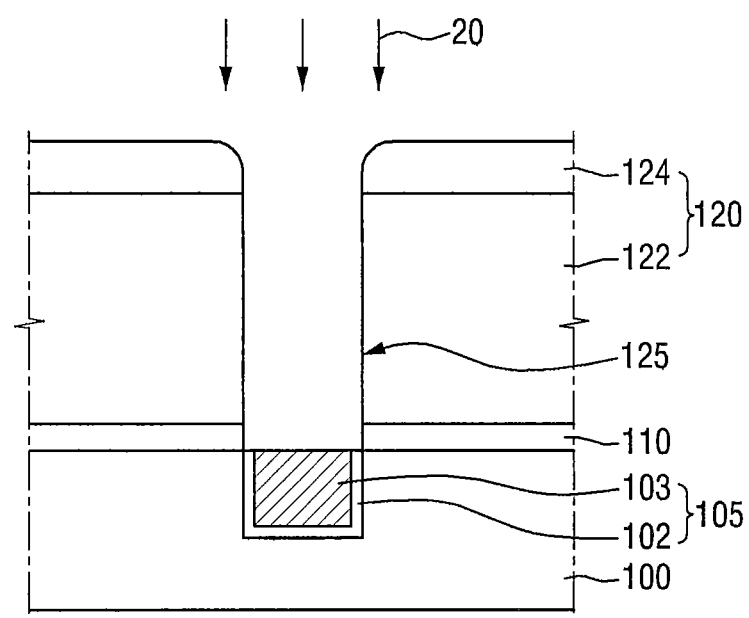

Referring to FIG. 9, the first liner layer 150 formed on the sidewalls and the bottom surface of the first trench 125 is removed. As the result, the lower pattern 105 is exposed.

The first part 151 of the first liner layer 150 exposed by removing the first sacrificial pattern 160 may be removed by, for example, a second wet etching process 20. That is to say, the lower pattern 105 is exposed by the second wet etching process 20.

In methods for fabricating semiconductor devices according to embodiments of the present inventive concepts, the second wet etching process 20 may employ a second wet etchant. The second wet etchant has etching selectivity to the first liner layer 150 and the lower pattern 105, thereby selectively etching one of the first liner layer 150 and the lower pattern 105.

In detail, the first liner layer 150 may be etched by the second wet etchant to then be removed. However, the lower pattern 105 may not be etched by the second wet etchant. In other words, the second wet etchant may selectively etch the first liner layer 150.

In the second wet etching process 20, the first part 151 of the first liner layer 150 is etched and removed. However, since the lower pattern 105 exposed by the first trench 125 is not etched by the second wet etching process 20, it may not be removed after the second wet etching process 20.

As described above, in some cases, the first lower mask pattern 130 and the lower pattern 105 may include the same metal element, that is, titanium, tungsten or tantalum. In more detail, the first lower mask pattern 130 and the lower pattern 105 may include the same metal compound in some embodiments.

When the first lower mask pattern 130 and the lower pattern 105 include the same metal compound, the first wet etchant used in the first wet etching process 10 may remove both of the first lower mask pattern 130 and the second part 152 of the first liner layer 150. However, the second wet etchant used in the second wet etching process 20 may etch the first part 151 of the first liner layer 150 but may not etch the lower pattern 105.

Therefore, the first wet etchant used in the first wet etching process 10 is different from the second wet etchant used in the second wet etching process 20. That is to say, the first wet etching process 10 and the second wet etching process 20 employ different wet etchants.

Figure 10:
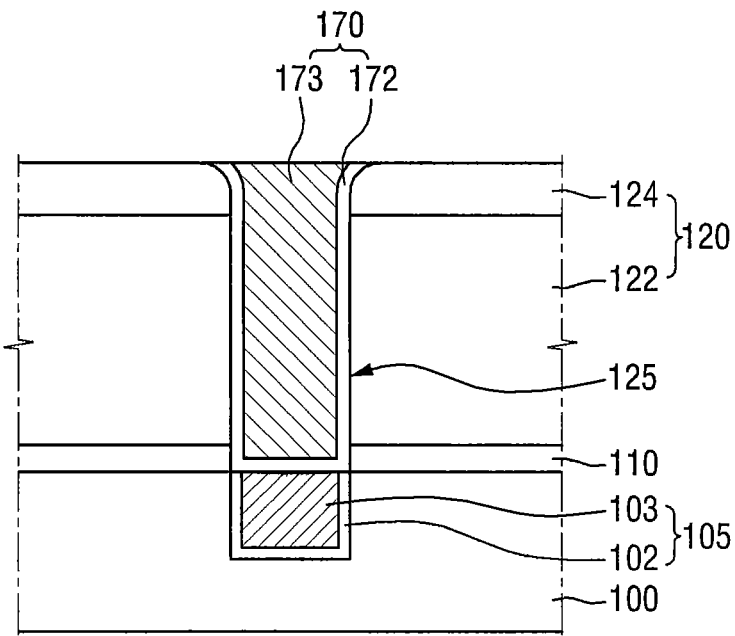

Referring to FIG. 10, the first upper pattern 170 is formed on the exposed lower pattern 105. The first upper pattern 170 fills the first trench 125. The first upper pattern 170 formed in the first trench 125 makes contact with the lower pattern 105 to then be electrically connected to the lower pattern 105.

The first upper pattern 170 may include a first upper barrier layer 172 and a first upper wiring layer 173. The first upper barrier layer 172 may be formed along the sidewalls of the first trench 125 and the lower pattern 105.

The first upper wiring layer 173 is formed on the first upper barrier layer 172. The first upper wiring layer 173 may be formed by filling the first trench 125 remaining after the first upper barrier layer 172 is formed.

The first upper barrier layer 172 may include, for example, tantalum, tantalum nitride, titanium, titanium nitride, ruthenium, cobalt, nickel, nickel boron, and/or tungsten nitride. The first upper barrier layer 172 may be formed by, for example, chemical vapor deposition and/or sputtering.

The first upper wiring layer 173 may include, for example, aluminum (Al), copper (Cu), tungsten (W), cobalt (Co), and/or combinations thereof. The first upper wiring layer 173 may be formed by, for example, chemical vapor deposition and/or electroplating.

Hereinafter, effects of methods for fabricating semiconductor devices according to embodiments of the present inventive concepts will be described.

In order to form a trench in an interlayer insulating layer for the purpose of forming an upper pattern, a hard mask pattern may be typically used as an etch mask. After forming the trench, the hard mask pattern should be removed for subsequent processes.

The hard mask pattern typically includes a metal compound including a metal element. For this reason, if the hard mask pattern is removed in a state in which a lower pattern is exposed, there is a high probability of the lower pattern being damaged while the hard mask pattern is removed.

In addition, in order to remove the hard mask pattern, an additional etching process is performed. Thus, there is a high probability of causing damage to the interlayer insulating layer including a low-k dielectric material.

However, as described above with regard to methods for fabricating the semiconductor devices according to embodiments of the present inventive concepts, if a liner layer is formed along a trench in the interlayer insulating layer, the lower pattern is protected by the liner layer while the hard mask pattern is removed. Therefore, it is possible to reduce or prevent the lower pattern from being damaged by the removing of the hard mask pattern.

In addition, since the liner layer is formed on the sidewalls of the trench formed in the interlayer insulating layer, it is possible to reduce or prevent the interlayer insulating layer from being additionally etched while the hard mask pattern is removed. Therefore, it is possible to reduce or prevent the interlayer insulating layer from being damaged by the removing of the hard mask pattern.

Methods for fabricating semiconductor devices according to further embodiments of the present inventive concepts will now be described with reference to FIGS. 1 to 7 and 11. For convenience in explanation, the following description will focus on differences from methods for fabricating the semiconductor device according to the previous embodiment shown in FIGS. 1 to 10.

Figure 11:
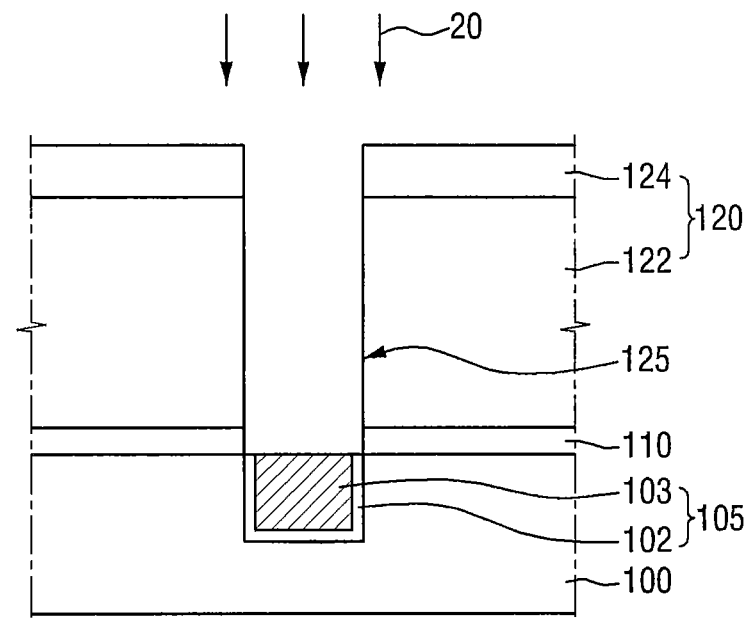
FIG. 11 illustrates an intermediate process step for explaining methods for fabricating semiconductor devices according to further embodiments of the present inventive concepts.

FIG. 11 illustrates intermediate process steps for explaining methods for fabricating semiconductor devices according to further embodiments of the present inventive concepts.

Referring to FIGS. 7 and 11, after removing a first sacrificial pattern 160, a first liner layer 150 formed on sidewalls and a bottom surface of a first trench 125 is removed. As the result, a lower pattern 105 is exposed.

A first part 151 of the first liner layer 150 exposed by removing the first sacrificial pattern 160 may be removed by, for example, a second wet etching process 20.

Next, as shown in FIG. 8, a top corner rounding (TCR) process is performed on a first upper interlayer insulating layer 124. In a case where a top corner of the first upper interlayer insulating layer 124 is angled, a TCR process may be additionally performed on the first upper interlayer insulating layer 124.

The top corner of the first upper interlayer insulating layer 124 may be made to be round by performing the TCR process.

That is to say, the upper portion of the first trench 125 may be rounded as the result of performing the TCR process.

In contrast with FIGS. 1 to 10, in methods for fabricating semiconductor devices according to further embodiments of the present inventive concepts, removing the first sacrificial pattern 160 and performing the TCR process are not performed in-situ.

Since the first part 151 of the first liner layer 150 is formed by a wet etching process, the removing of the first sacrificial pattern 160 and the performing of the TCR process are not performed in-situ.

Next, as shown in FIG. 10, a first upper pattern 170 is formed in the first trench 125.

Methods for fabricating semiconductor devices according to still further embodiments of the present inventive concepts will now be described with reference to FIGS. 12 to 22. For convenience in explanation, the following description will focus on differences from methods for fabricating the semiconductor device according to the previous embodiment shown in FIGS. 1 to 10.

FIGS. 12 to 22 illustrate intermediate process steps for explaining methods for fabricating semiconductor devices according to still further embodiments of the present inventive concepts.

Figure 12:
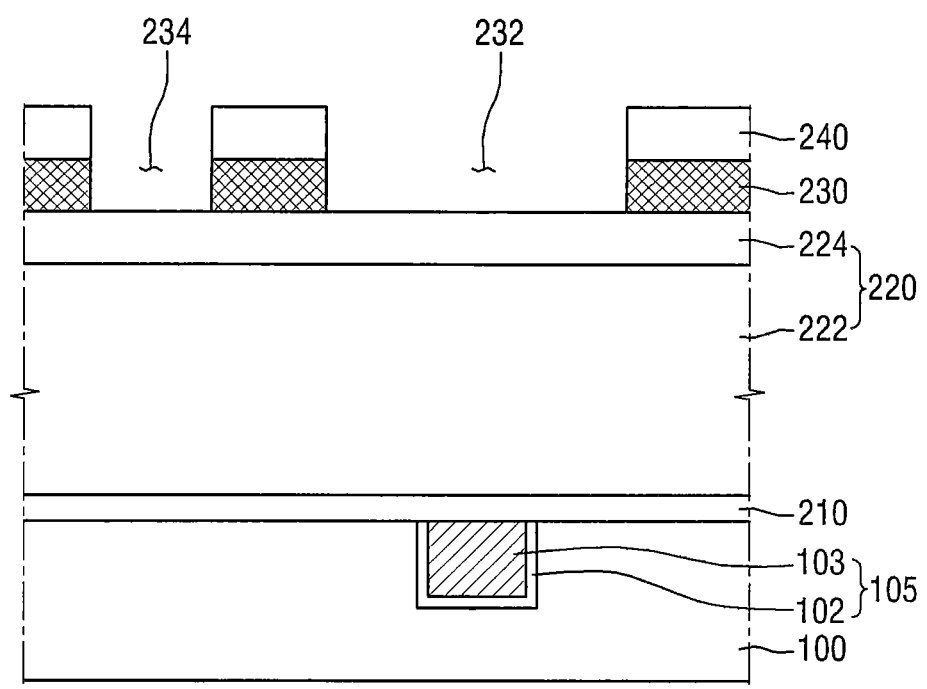
FIGS. 12 to 22 illustrate intermediate process steps for explaining methods for fabricating semiconductor devices according to still further embodiments of the present inventive concepts.

Referring to FIG. 12, a second etch stop layer 210 and a second interlayer insulating layer 220 are sequentially formed on a substrate 100 including a lower pattern 105.

Second mask patterns 230 and 240 including a second opening 232 and a third opening 234 spaced apart from each other are formed on the second interlayer insulating layer 220.

In detail, the second etch stop layer 210 and the second interlayer insulating layer 220 are sequentially formed on the substrate 100 including the lower pattern 105. The second interlayer insulating layer 220 may include a second lower interlayer insulating layer 222 and a second upper interlayer insulating layer 224. The second etch stop layer 210 may include a material having etching selectivity to the second interlayer insulating layer 220.

Descriptions of the second etch stop layer 210, the second upper interlayer insulating layer 224 and the second lower interlayer insulating layer 222 are substantially the same as those of the first etch stop layer 110, the first upper interlayer insulating layer 124 and the first lower interlayer insulating layer 122, and repeated descriptions thereof will be omitted for brevity.

The second mask patterns 230 and 240 are formed on the second interlayer insulating layer 220. The second mask patterns 230 and 240 may include a second lower mask pattern 230 and the second upper mask pattern 240.

Of the second mask patterns 230 and 240, the second lower mask pattern 230 may be, for example, a hard mask pattern. The second lower mask pattern 230 may include, for example, titanium nitride, titanium, titanium oxide, tungsten, tungsten nitride, tungsten oxide, tantalum, tantalum nitride, and/or tantalum oxide.

In some cases, the second lower mask pattern 230 and the lower pattern 105 may include the same metal element, that is, titanium, tungsten, and/or tantalum. In more detail, the second lower mask pattern 230 and the lower pattern 105 may include the same metal compound.

The second upper second mask pattern 240 may include the same material as, for example, the second upper interlayer insulating layer 224, but aspects of the present disclosure are not limited thereto.

A top surface of the second interlayer insulating layer 220, that is, the second upper interlayer insulating layer 224, is exposed by the second opening 232 and the third opening 234 included in the second lower mask pattern 230.

Figure 13:
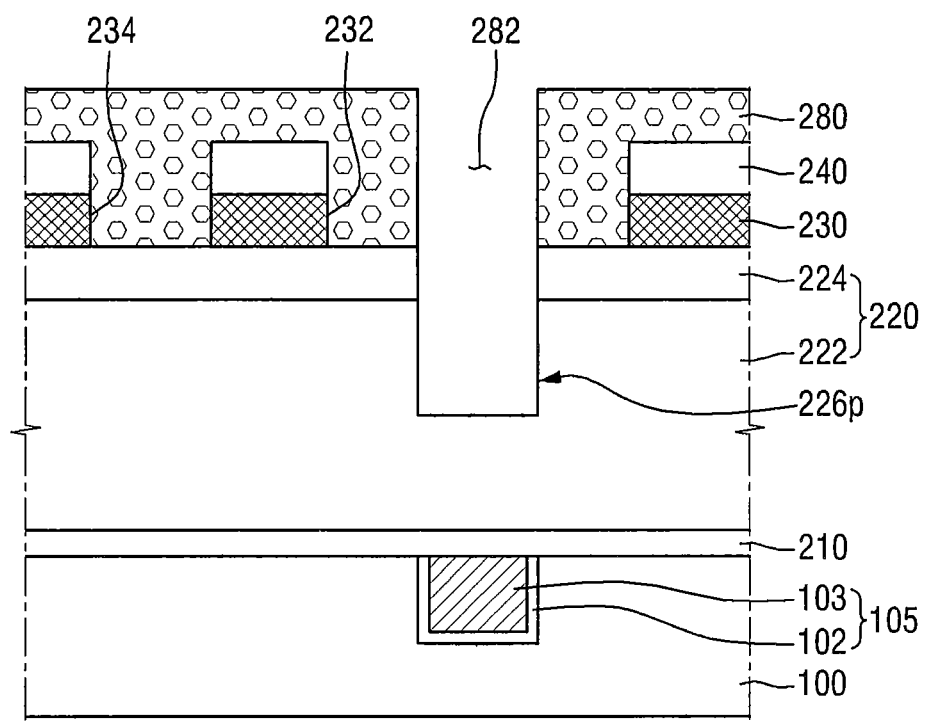

Referring to FIG. 13, a photoresist layer pattern 280 including a fourth opening 282 is formed on the second interlayer insulating layer 220 and the second lower mask pattern 230.

A second pre-trench 226p is formed in the second interlayer insulating layer 220 using a photoresist layer pattern 280 as an etch mask.

In detail, a photoresist layer is formed on the second interlayer insulating layer 220 and the second lower mask pattern 230. The fourth opening 282 is formed by a photolithography process, thereby forming the photoresist layer pattern 280. Since a portion of the photoresist layer pattern 280 fills the third opening 234, the third opening 234 is not exposed by the photoresist layer pattern 280.

The fourth opening 282 overlaps with the second opening 232, and a width of the fourth opening 282 is smaller than that of the second opening 232. In FIG. 13, the fourth opening 282 entirely overlapping with the second opening 232 is illustrated, which is only for convenience in explanation, but aspects of the present disclosure are not limited thereto.

The fourth opening 282 exposes a top surface of the second upper interlayer insulating layer 224. The fourth opening 282 may expose a portion of the second upper interlayer insulating layer 224 exposed by the second opening 232. That is to say, the fourth opening 282 exposes the portion of the second upper interlayer insulating layer 224 overlapping with the second opening 232.

A second pre-trench 226p is formed in the second interlayer insulating layer 220 using the photoresist layer pattern 280 as an etch mask. That is to say, the second pre-trench 226p is formed on a portion of a top surface of the second interlayer insulating layer 220 overlapping with the second opening 232. The second pre-trench 226p is formed in the portion of the second interlayer insulating layer 220 exposed by the second opening 232 when the second lower mask pattern 230 is formed.

For example, the second pre-trench 226p may be formed by removing portions of the second upper interlayer insulating layer 224 and the second lower interlayer insulating layer 222. The second pre-trench 226p may not expose the second etch stop layer 210 positioned under the second interlayer insulating layer 220.

The second pre-trench 226p may be formed by, for example, a dry etching process.

When the second pre-trench 226p is formed, the top surface of the second interlayer insulating layer 220 that is not exposed by the fourth opening 282 is not etched. Therefore, there is a step difference between a bottom surface of the second pre-trench 226p and the top surface of the second interlayer insulating layer 220.

After forming the second pre-trench 226p, the photoresist layer pattern 280 is removed. As the result, the portion of the top surface of the second interlayer insulating layer 220 and the second mask patterns 230 and 240 may be exposed.

When the photoresist layer pattern 280 is removed, the second upper second mask pattern 240 formed on the second lower mask pattern 230 may also be removed, but aspects of the present disclosure are not limited thereto. That is to say, the second upper second mask pattern 240 may be removed in a subsequent process of forming a second trench (225 of FIG. 14).

Figure 14:
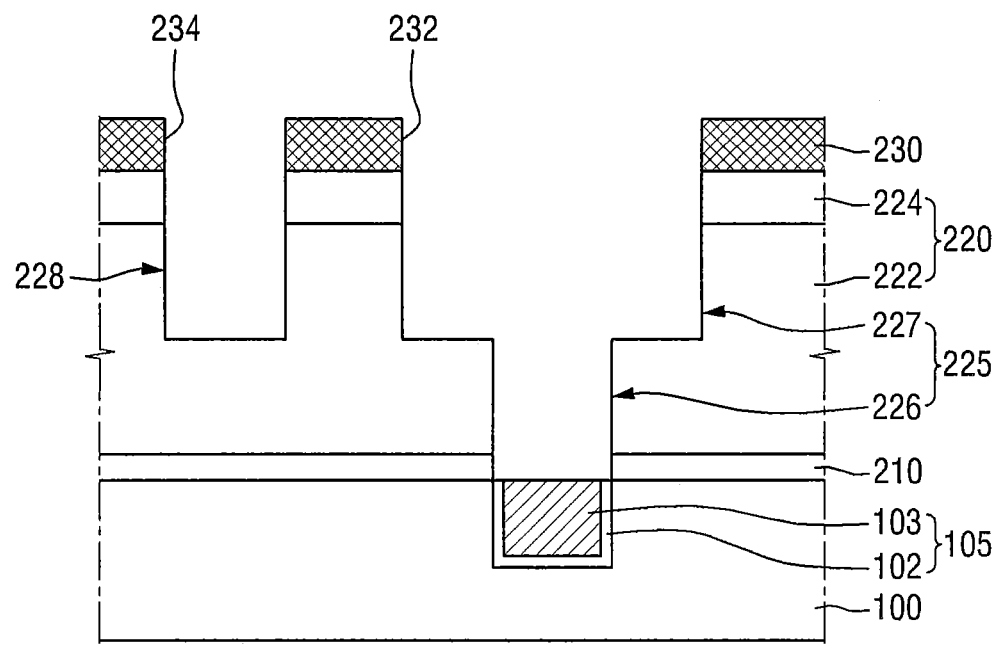

Referring to FIG. 14, the second trench 225 and a third trench 228 are formed in the second interlayer insulating layer 220 using the second lower mask pattern 230 as an etch mask. The second trench 225 includes a second upper trench 227 and a second lower trench 226.

The second upper trench 227 is formed to correspond to the second opening 232 of the second lower mask pattern 230 while not exposing the second etch stop layer 210. The third trench 228 is formed to correspond to the third opening 234 of the second lower mask pattern 230 while not exposing the second etch stop layer 210.

A bottom surface of the second upper trench 227 and a bottom surface of the third trench 228 may be spaced a substantially equal distance apart from the second etch stop layer 210. The second upper trench 227 and the third trench 228 may be formed by removing portions of the second upper insulating layer 224 and the second lower insulating layer 222.

While the second upper trench 227 is formed using the second lower mask pattern 230 as an etch mask, the second lower trench 226 passing through the second etch stop layer 210 is formed at a region corresponding to the second pre-trench 226p.

Since there is a step difference between the bottom surface of the second pre-trench 226p and the top surface of the second interlayer insulating layer 220, as shown in FIG. 13, the bottom surface of the second pre-trench 226p is further etched while the second upper trench 227 is formed. As the result of the etching, the second pre-trench 226p further extends toward the substrate 100 to then pass through the second etch stop layer 210.

Therefore, the second lower trench 226 is formed at a region corresponding to the second pre-trench 226p. In other words, the second lower trench 226 is formed on the bottom surface of the second upper trench 227.

The lower pattern 105 positioned under the second interlayer insulating layer 220 is exposed by forming the second trench 225 in the second interlayer insulating layer 220.

Figure 15:
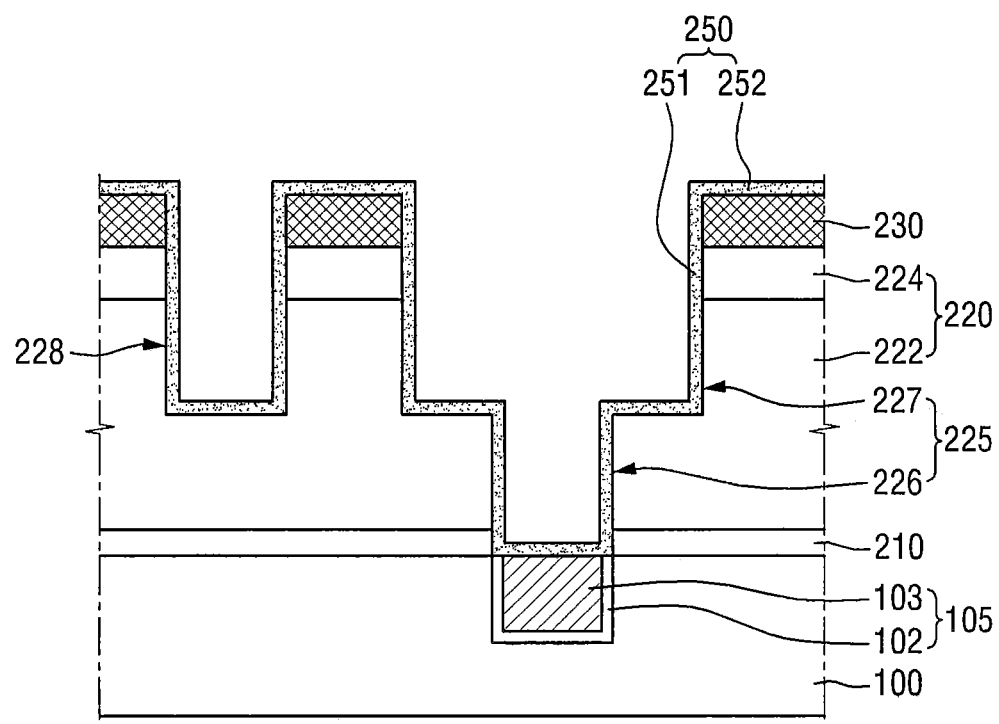

Referring to FIG. 15, a second liner layer 250 is formed on the second lower mask pattern 230. The second liner layer 250 is formed on sidewalls and a bottom surface of the second trench 225, on sidewalls and a bottom surface of the third trench 228 and on the second lower mask pattern 230.

The second liner layer 250 may include a first part 251 and a second part 252. The first part 251 of the second liner layer 250 is formed along the sidewalls and the bottom surface of the second upper trench 227 and the sidewalls and the bottom surface of the second lower trench 226. The second part 252 of the second liner layer 250 is formed on the top surface of the second lower mask pattern 230.

A portion of the first part 251 of the second liner layer 250 may contact the lower pattern 105. That is to say, the first part 251 of the second liner layer 250 formed on the bottom surface of the second lower trench 226 may contact the lower pattern 105.

A description of the second liner layer 250 is substantially the same as that of the first liner layer 150 and a repeated description thereof will be omitted for brevity.

Figure 16:
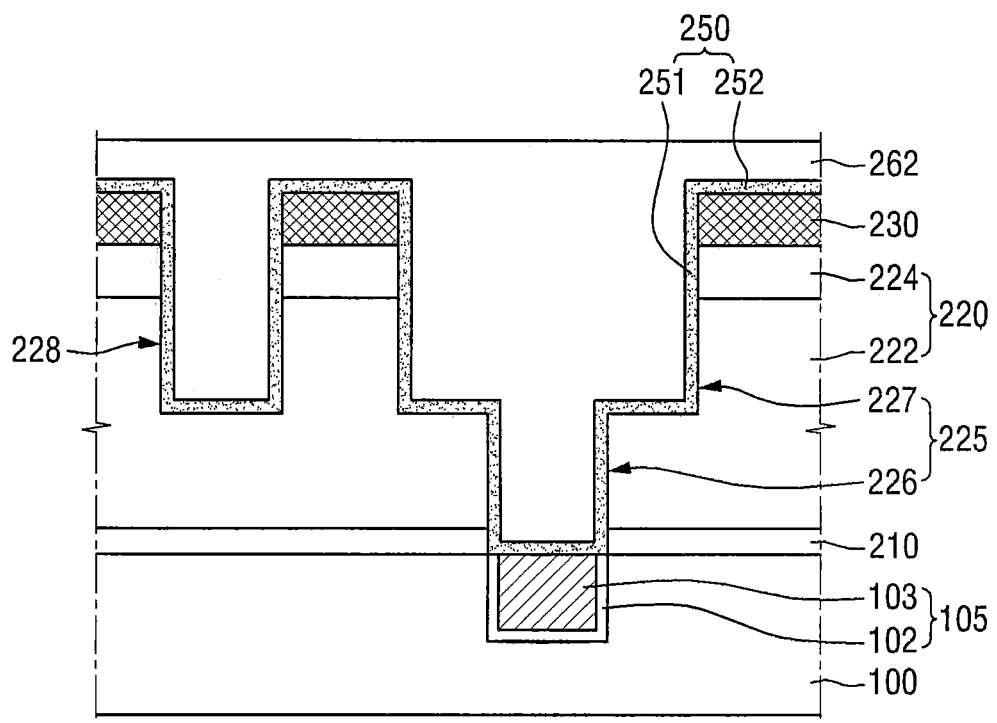

Referring to FIG. 16, a second sacrificial layer 262 is formed, the second sacrificial layer 262 covering the second liner layer 250 while filling the second trench 225 and the third trench 228.

The second sacrificial layer 262 fills the second trench 225 where the second liner layer 250 is formed, and the third trench 228. The second sacrificial layer 262 is formed on the second lower mask pattern 230 which the second liner layer 250 is formed.

The second sacrificial layer 262 is formed on the first part 251 of the second liner layer 250 in the second trench 225 and the third trench 228 and on the second part 252 of the second liner layer 250 on the top surface of the second lower mask pattern 230.

A description of the second sacrificial layer 262 is substantially the same as that of the first sacrificial layer 162 and a repeated description thereof will be omitted for brevity.

Figure 17:
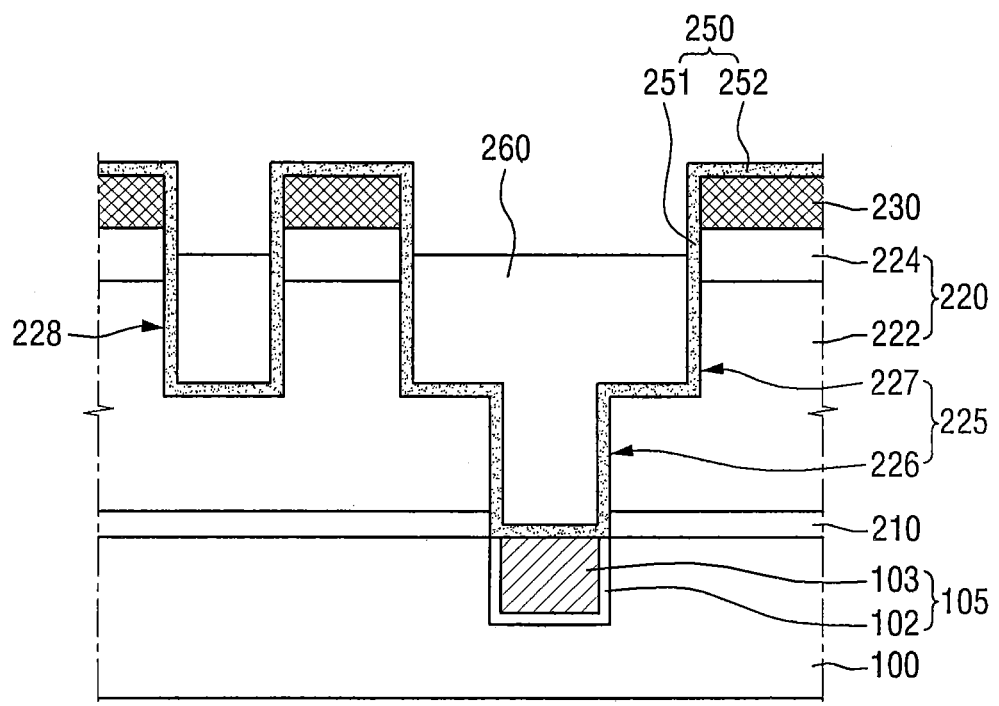

Referring to FIG. 17, a second sacrificial pattern 260 is formed in the second trench 225 and the third trench 228. Since the second sacrificial pattern 260 is formed in the second trench 225 and the third trench 228, the second part 252 of the second liner layer 250 is exposed by the second sacrificial pattern 260.

A portion of the second sacrificial layer 262 covering the second liner layer 250 is removed. The second sacrificial layer 262 formed on the second part 252 of the second liner layer 250 is removed. The remaining portion resulting from the removing of the portion of the second sacrificial layer 262 may become the second sacrificial pattern 260.

As the result, the second sacrificial pattern 260 is formed in the second trench 225 and the third trench 228, the second sacrificial pattern 260 exposing the second part 252 of the second liner layer 250.

The second sacrificial pattern 260 may block the second liner layer 250 formed in the second trench 225, that is, the first part 251 of the second liner layer 250. In more detail, the second sacrificial pattern 260 may protect the second liner layer 250 formed on the bottom surface of the second lower trench 226.

Figure 18:
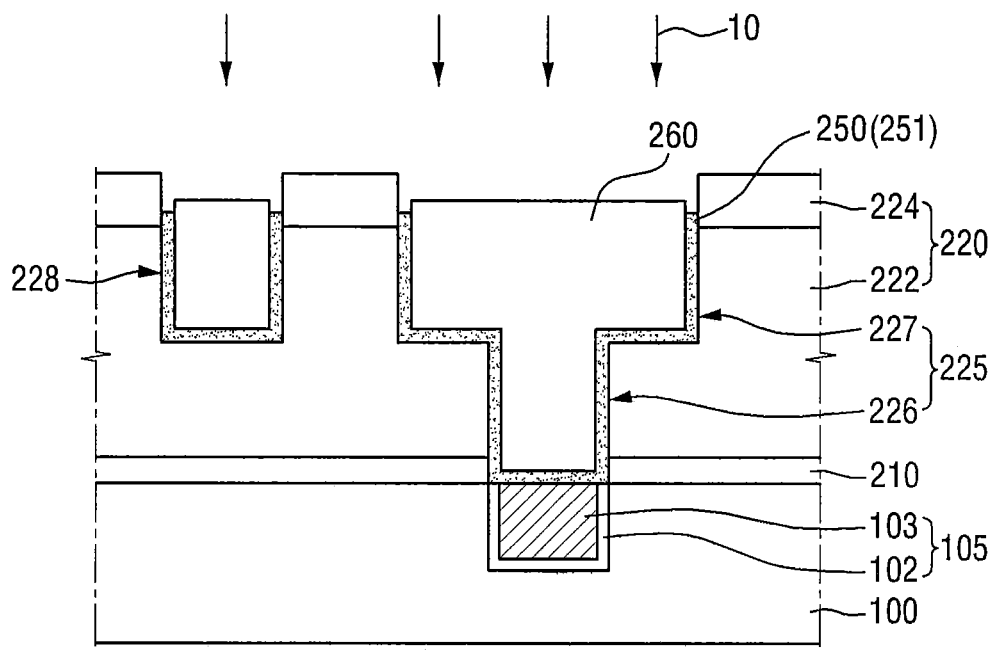

Referring to FIG. 18, the second part 252 of the second liner layer 250 and the second lower mask pattern 230 are removed using the second sacrificial pattern 260. Accordingly, the second interlayer insulating layer 220, that is, the second upper interlayer insulating layer 224, is exposed.

The second part 252 of the second liner layer 250 and the second lower mask pattern 230 may be removed by, for example, a first wet etching process 10. The second sacrificial pattern 260 may be used as an etch mask in the first wet etching process 10.

The removing of the second part 252 of the second liner layer 250 and the second lower mask pattern 230 by the first wet etching process 10 is substantially the same as described above with reference to FIG. 6 and a repeated description thereof will be omitted for brevity.

Figure 19:
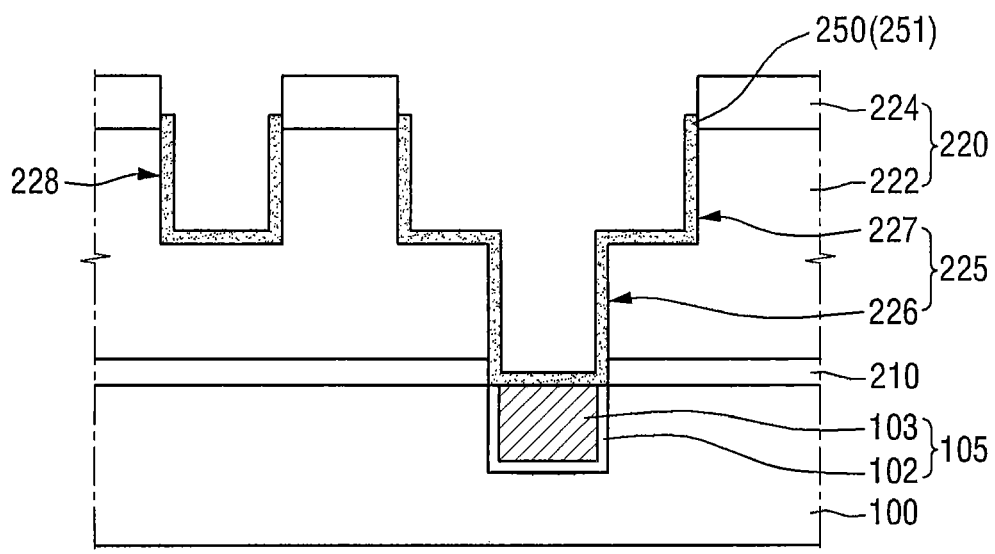

Referring to FIG. 19, the second sacrificial pattern 260 formed in the second trench 225 and the third trench 228 is removed. As the result of the removing of the second sacrificial pattern 260, the first part 251 of the second liner layer 250 formed in the second trench 225 and the third trench 228 is exposed.

That is to say, the second sacrificial pattern 260 is removed, thereby exposing the second liner layer 250 formed in the second trench 225 and the third trench 228.

Figure 20:
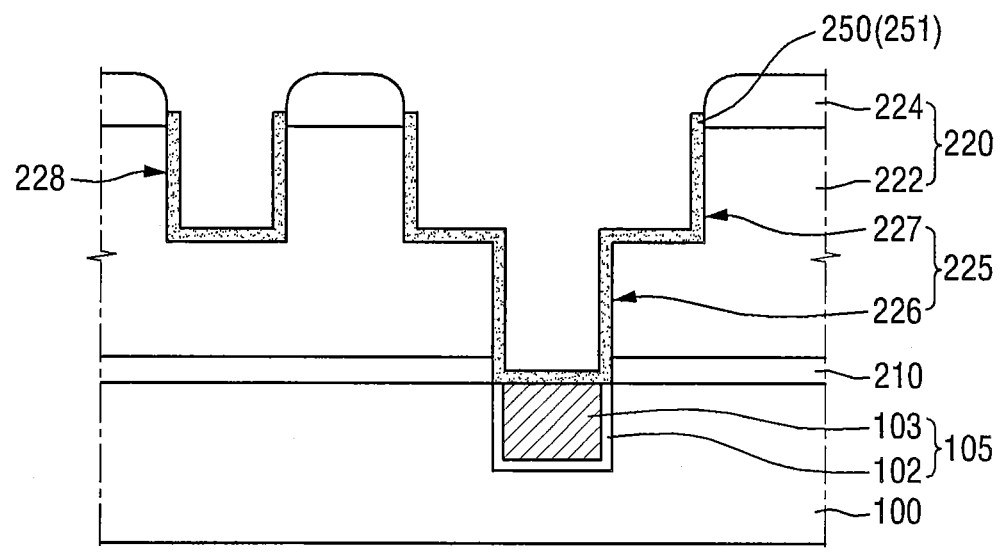

Referring to FIG. 20, a top corner rounding (TCR) process is performed on the second upper interlayer insulating layer 224.

A top corner of the second upper interlayer insulating layer 224 may be made to be rounded by performing a TCR process. That is to say, upper portions of the second trench 225 and the third trench 228 may be rounded by the TCR process.

Figure 21:
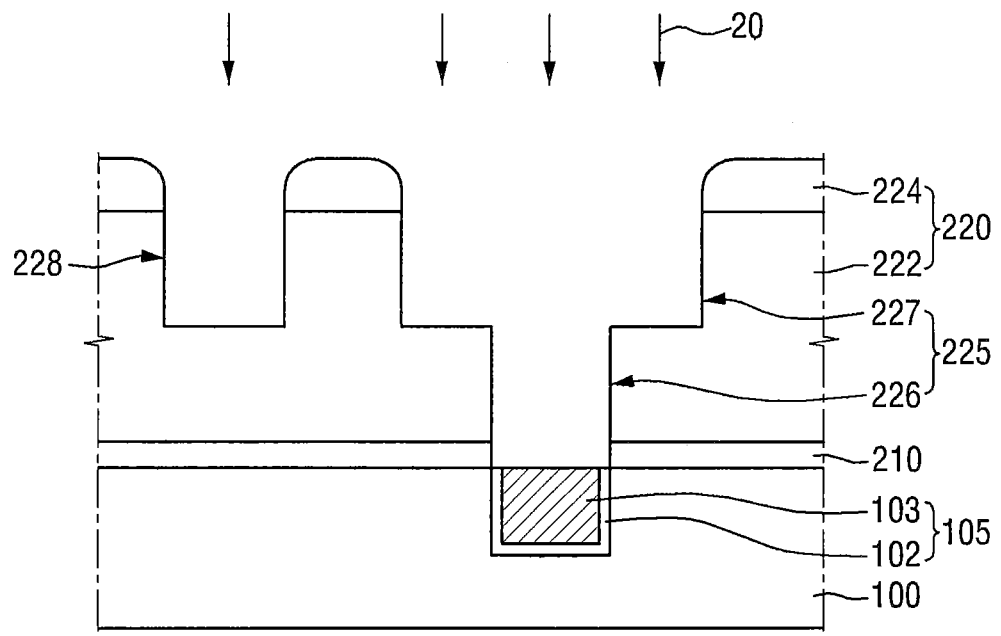

Referring to FIG. 21, the second liner layer 250 is removed, the second liner layer 250 formed along the sidewalls and the bottom surface of the second trench 225 and the sidewalls and the bottom surface of the third trench 228. In such a manner, the lower pattern 105 is exposed.

The first part 251 of the second liner layer 250 exposed by removing the second sacrificial pattern 260 may be removed by, for example, a second wet etching process 20. That is to say, the lower pattern 105 is exposed by the second wet etching process 20.

The removing of the first part 251 of the second liner layer 250 by the second wet etching process 20 is substantially the same as described above with reference to FIG. 9, and a repeated description thereof will be omitted for brevity.

Figure 22:
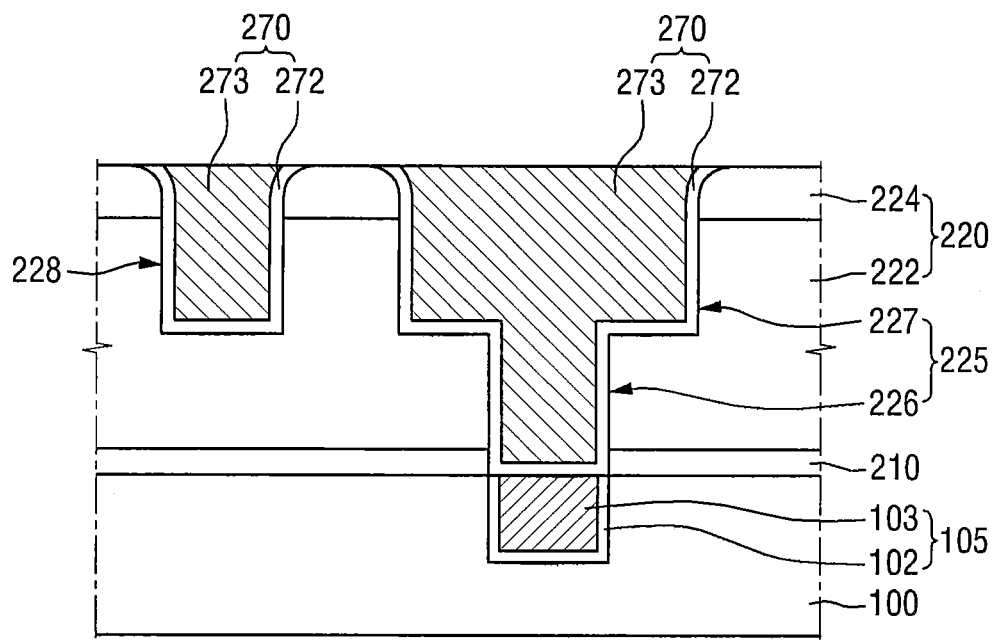

Referring to FIG. 22, a second upper pattern 270 is formed in the second trench 225 and the third trench 228.

The second upper pattern 270 in the second trench 225 is formed on the exposed lower pattern 105 to then be electrically connected to the lower pattern 105.

The second upper pattern 270 may include a second upper barrier layer 272 and a second upper wiring layer 273. The second upper barrier layer 272 may be formed along sidewalls and bottom surfaces of the second trench 225 and the third trench 228.

The second upper wiring layer 273 is formed on the second upper barrier layer 272. The second upper wiring layer 273 may be formed by filling the second trench 225 and the third trench 228 remaining after forming the second upper barrier layer 272.

A description of the second upper pattern 270 is substantially the same as that of the first upper pattern 170 and a repeated description thereof will be omitted for brevity.

Methods for fabricating semiconductor devices according to still further embodiments of the present inventive concepts will now be described with reference to FIGS. 12 to 19 and 23. For convenience in explanation, the following description will focus on differences from methods for fabricating the semiconductor device according to the previous embodiment shown in FIGS. 12 to 22.

Figure 23:
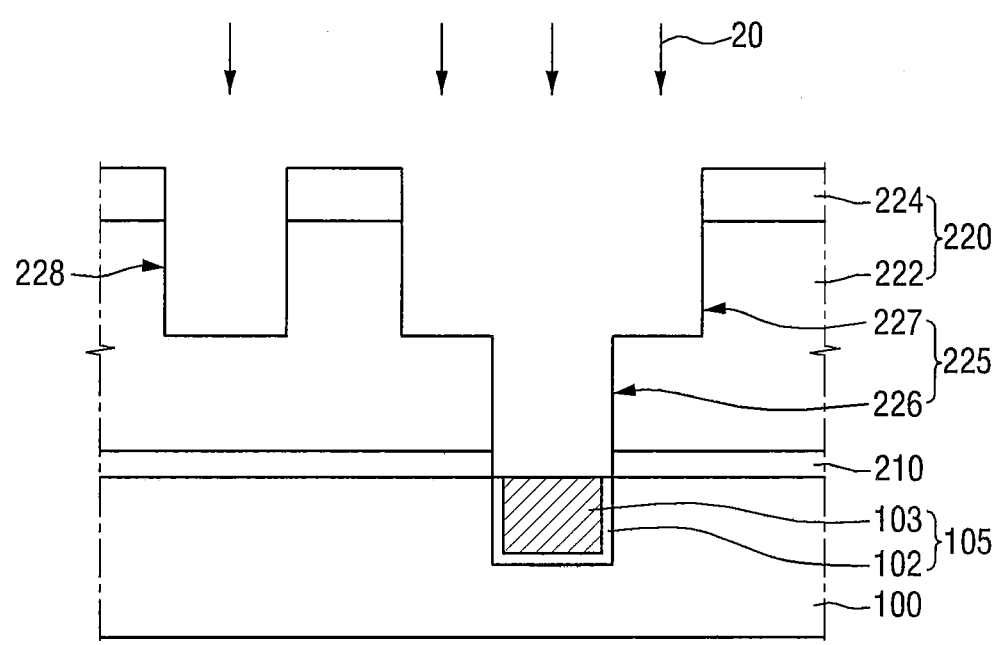
FIG. 23 illustrates an intermediate process steps for explaining methods for fabricating semiconductor devices according to still further embodiments of the present inventive concepts.

FIG. 23 illustrates intermediate process steps for explaining methods for fabricating semiconductor devices according to still further embodiments of the present inventive concepts.

Referring to FIGS. 19 and 23, after removing a second sacrificial pattern 260, a second liner layer 250 is removed, the second liner layer 250 formed on sidewalls and a bottom surface of a second trench 225 and a sidewalls and a bottom surface of a third trench 228. As the result, a lower pattern 105 is exposed.

A second part 251 of the second liner layer 250 exposed by removing the second sacrificial pattern 260 may be removed by, for example, a second wet etching process 20.

Next, as shown in FIG. 20, a top corner rounding (TCR) process is performed on a second upper interlayer insulating layer 224.

Next, as shown in FIG. 22, a second upper pattern 270 is formed in a second trench 225 and a third trench 228.

Figure 24:
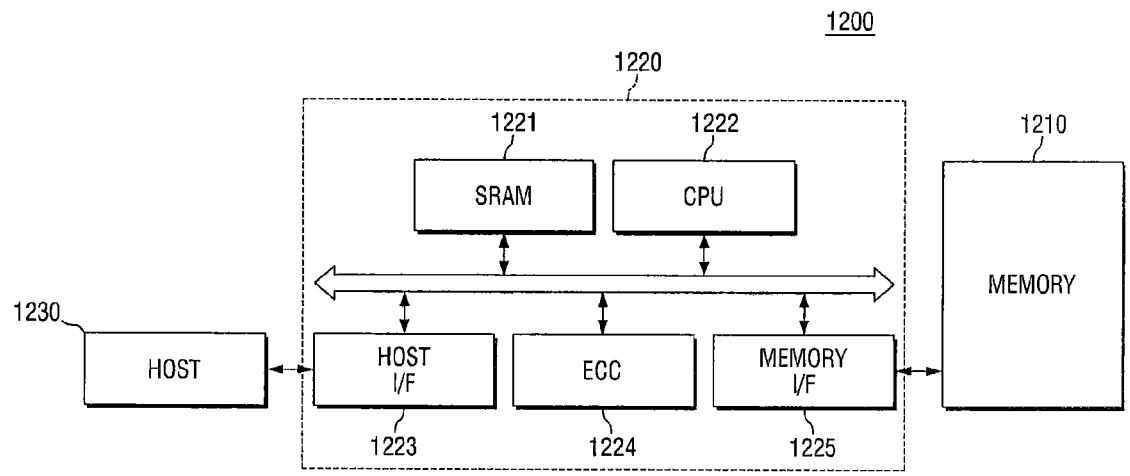
FIG. 24 is a block diagram of a memory card incorporating semiconductor devices fabricated by a fabricating method according to some embodiments of the present inventive concepts.

FIG. 24 is a block diagram of a memory card (1200) incorporating semiconductor devices fabricated by a fabricating method according to some embodiments of the present inventive concepts.

Referring to FIG. 24, a memory 121Q incorporating semiconductor devices fabricated by a fabricating method according to some embodiments of the present inventive concepts may be employed by the memory card 1200. The memory card 1200 includes a memory controller 1220 controlling the exchange of data between a host 1230 and the memory 1210. An SRAM 1221 may be used as an operational memory of a central processing unit (CPU) 1222. A host interface (I/F) 1223 is equipped with a data communication protocol for data exchange of the host 1230 connected with the memory card 1200. An error correction code (ECC) unit 1224 may detect and correct an error bit(s) included in the data read from the memory 1210. The memory I/F 1225 may perform interfacing with the memory 100. The CPU 1222 performs general control operations to exchange data of the memory controller 1220.

Figure 25:
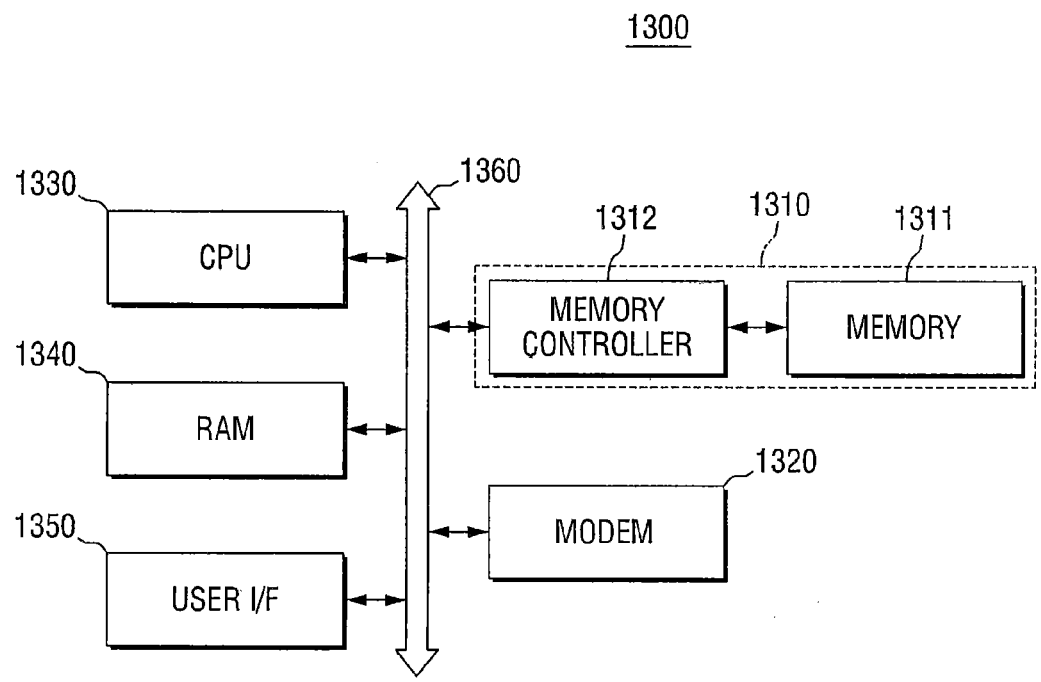
FIG. 25 is a block diagram showing an information processing system using semiconductor devices fabricated by a fabricating method according to some exemplary embodiments of the present inventive concepts.

FIG. 25 is a block diagram showing an information processing system (1300) using semiconductor devices fabricated by a fabricating method according to some exemplary embodiments of the present inventive concepts.

Referring to FIG. 25, the information processing system 1300 may include a memory system 1310, a modem 1320, a central processing unit (CPU) 1330, a random access memory (RAM) 1340 and a user interface 1350, which are connected to a system bus 1360. The memory system 1310 may include a memory 1311 and a memory controller 1312. The memory system 1310 may be configured substantially the same as the memory card 1200 described above with respect to FIG. 24. The memory system 1310 may store data processed by the CPU 1330 or data provided from an external device. The information processing system 1300 may be applied to a memory card, a solid state disk (SSD), a camera image processor (CIS), and/or other various application chipsets. For example, the memory system 1310 may be configured to employ or be used in a SSD. In this case, the information processing system 1300 may process large-capacity data in a stable, reliable manner.

Figure 26:
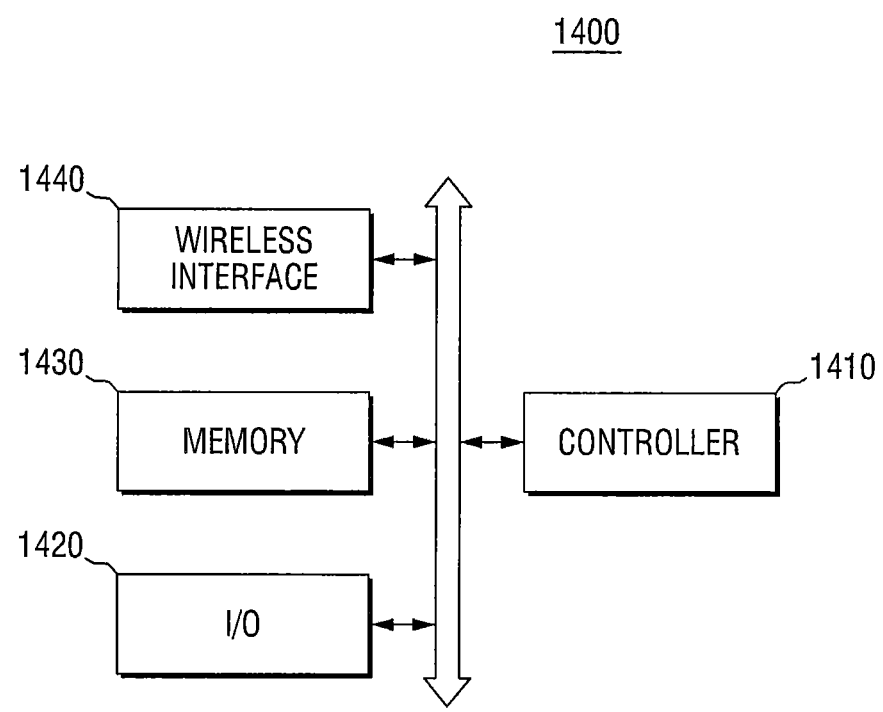
FIG. 26 is a block diagram of an electronic system including semiconductor devices according to some embodiments of the present inventive concepts.

FIG. 26 is a block diagram of an electronic system including semiconductor devices according to some embodiments of the present inventive concepts.

Referring to FIG. 26, the electronic system 1400 may include semiconductor devices according to some embodiments of the present inventive concepts. The electronic system 1400 may be applied to a wireless communication device, such as a personal digital assistant (PDA), a portable computer, a web tablet, a wireless phone, a mobile phone, a digital music player, a memory card, and/or any other type of electronic device capable of transmitting and/or receiving information in a wireless environment.

The electronic system 1400 may include a controller 1410, an input/output device (I/O) 1420, a memory 1430, and a wireless interface 1440. Here, the memory 1430 may include semiconductor devices fabricated according to various embodiments of the present inventive concepts. The controller 1410 may include a microprocessor, a digital signal processor, a microcontroller, and logic devices capable of performing functions similar to those of these components. The I/O 1420 may include a keypad, a keyboard, a display, and so on. The memory 1430 may store commands (or user data) processed by the controller 1410. The wireless interface 1440 may be used to transmit data to a communication network or receive data through a wireless data network. The wireless interface 1440 may include an antenna and/or a wireless transceiver. The electronic system 1400 according to some embodiments of the present inventive concepts may be used in a third generation communication system such as CDMA, GSM, NADC, E-TDMA, WCDMA and CDMA2000.

While the present inventive concepts has been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. A method for fabricating a semiconductor device, the method comprising:
sequentially forming an interlayer insulating layer and a hard mask pattern including a first opening therein on a substrate including a lower pattern;
forming a trench in the interlayer insulating layer using the hard mask pattern, wherein the trench exposes the lower pattern;
forming a liner layer including a first part extending along sidewalls and a bottom surface of the trench and a second part extending along a top surface of the hard mask pattern;
forming a sacrificial pattern in the trench, wherein the sacrificial pattern exposes the second part of the liner layer;
removing the second part of the liner layer and the hard mask pattern using the sacrificial pattern as an etch mask; and
after the removing of the hard mask pattern, removing the sacrificial pattern to expose the first part of the liner layer.

2. The method of claim 1, further comprising:
exposing the lower pattern by removing the exposed first part of the liner layer; and
forming an upper pattern in the trench on the exposed lower pattern.

3. The method of claim 2, wherein the exposed first part of the liner layer is removed using a wet etchant having etching selectivity between the lower pattern and the liner layer.

4. The method of claim 2, wherein the interlayer insulating layer includes a lower interlayer insulating layer and an upper interlayer insulating layer formed on the lower interlayer insulating layer,
wherein the removing of the hard mask pattern includes exposing the upper interlayer insulating layer, and
the method further comprises performing a top corner rounding (TCR) process on the upper interlayer insulating layer between the removing of the sacrificial pattern and the removing of the exposed first part of the liner layer, or between the removing of the exposed first part of the liner layer and the forming of the upper pattern.

5. The method of claim 4, wherein, when the TCR process is performed between the removing of the sacrificial pattern and the removing of the exposed first part of the liner layer, the removing of the sacrificial pattern and the performing of the TCR process are performed in-situ.

6. The method of claim 1, wherein the forming of the sacrificial pattern comprises:
forming a sacrificial layer on the second part of the liner layer and in the trench; and
exposing the second part of the liner layer by removing a portion of the sacrificial layer to define the sacrificial pattern.

7. The method of claim 6, wherein the portion of the sacrificial layer and the sacrificial pattern are removed using a dry etching process.

8. The method of claim 1, wherein the second part of the liner layer and the hard mask pattern are removed together using a wet etching process.

9. The method of claim 1, wherein the forming of the trench comprises:
forming a photoresist layer pattern including a second opening on the hard mask pattern, the second opening overlapping with the first opening and having a smaller width than the first opening,
forming a pre-trench in the interlayer insulating layer using the photoresist layer pattern as an etch mask; and
after removing of the photoresist layer pattern, etching the interlayer insulating layer using the hard mask pattern as an etch mask.

10. The method of claim 9, wherein the trench includes an upper trench formed to correspond to the first opening and a lower trench formed on a bottom surface of the upper trench, and wherein the lower trench is formed from the pre-trench extending toward the substrate, and wherein the lower pattern is exposed by the lower trench.

11. A method for fabricating a semiconductor device, the method comprising:

forming a lower interlayer insulating layer, an upper interlayer insulating layer and a hard mask pattern on a substrate including a lower pattern, the hard mask pattern including titanium nitride;

forming a trench exposing the lower pattern in each of the upper interlayer insulating layer and the lower interlayer insulating layer using the hard mask pattern;

conformally forming an aluminum compound layer along sidewalls and a bottom surface of the trench and on a top surface of the hard mask pattern;

forming a sacrificial layer on the aluminum compound layer and in the trench;

forming a sacrificial pattern exposing the aluminum compound layer on the top surface of the hard mask pattern by removing a portion of the sacrificial layer;

removing the aluminum compound layer on the top surface of the hard mask pattern and the hard mask pattern together using the sacrificial pattern as a wet etch mask;

exposing the aluminum compound layer in the trench by removing the sacrificial pattern; and exposing the lower pattern by removing the exposed aluminum compound layer in the trench using a first wet etching process.

12. The method of claim 11, further comprising:

performing a top corner rounding (TCR) process on the upper interlayer insulating layer between the removing of the sacrificial pattern and the performing of the first wet etching process, or after the performing of the first wet etching process.

13. The method of claim 11, wherein:

the lower pattern includes a barrier layer and a wiring layer, the barrier layer includes titanium and/or titanium nitride, and the wiring layer includes tungsten and/or cobalt;

the aluminum compound layer includes aluminum nitride, aluminum oxynitride, aluminum carbonitride, aluminum carbon oxynitride, and/or aluminum oxide; or the lower interlayer insulating layer includes a low-k dielectric material layer.

14. A method of fabricating a semiconductor device, the method comprising:

patterning an interlayer insulating layer including a hard mask pattern thereon to define a trench therein, wherein the trench in the interlayer insulating layer exposes a lower pattern on a layer therebelow;

prior to removing the hard mask pattern, forming a liner layer extending along sidewalls and a bottom surface of the trench;

performing a first etching process to remove the hard mask pattern without removing portions of the liner layer extending along the bottom surface of the trench; and after removing the hard mask pattern, performing a second etching process to remove the portions of the liner layer extending along the bottom surface of the trench.

15. The method of claim 14, wherein the liner layer contacts the lower pattern, and wherein the second etching process comprises a wet etching process that is selective between the liner layer and the lower pattern.

16. The method of claim 15, wherein the lower pattern and the hard mask pattern comprise a same metal.

17. The method of claim 16, wherein the first etching process comprises a wet etching process that is not selective between the hard mask pattern and the liner layer.

18. The method of claim 17, wherein performing the first etching process to remove the hard mask pattern without removing the portions of the liner layer extending along the bottom surface of the trench comprises:

forming a sacrificial pattern in the trench covering the liner layer at the bottom surface thereof, wherein the sacrificial pattern exposes portions of the liner layer extending along the sidewalls of the trench, wherein the first etching process removes the hard mask pattern and the portions of the liner layer extending along the sidewalls of the trench that are exposed by the sacrificial pattern, and further comprising:

after removing the hard mask pattern using the first etching process, removing the sacrificial pattern to expose the portions of the liner layer extending along the bottom surface of the trench, prior to performing the second etching process.

19. The method of claim 16, wherein performing the second etching process to remove the portions of the liner layer extending along the bottom surface of the trench exposes the lower pattern, and further comprising:

after removing the portions of the liner layer extending along the bottom surface of the trench using the second etching process, forming an upper pattern in the trench, wherein the upper pattern contacts the lower pattern and is electrically connected thereto.

20. The method of claim 16, wherein patterning the interlayer insulating layer to define the trench comprises:

forming a photoresist pattern on the hard mask pattern, the photoresist pattern defining a narrower opening than that defined by the hard mask pattern, forming a pre-trench in the interlayer insulating layer using the photoresist pattern as an etch mask, wherein the pre-trench does not expose the lower pattern; and then etching the interlayer insulating layer including the pre-trench therein using the hard mask pattern as an etch mask to expose the lower pattern.

* * * * *